United States Patent
Ikoma et al.

(10) Patent No.: US 6,625,187 B1
(45) Date of Patent: Sep. 23, 2003

(54) SEMICONDUCTOR OPTICAL DEVICE AND METHOD OF MANUFACTURING THE SAME

(75) Inventors: Nobuyuki Ikoma, Kanagawa (JP);
Akira Ishida, Kanagawa (JP);
Shigenori Takagishi, Kanagawa (JP);
Mitsuo Takahashi, Kanagawa (JP);
Tsukuru Katsuyama, Kanagawa (JP);
Masayuki Shigematsu, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 122 days.

(21) Appl. No.: 09/714,178

(22) Filed: Nov. 17, 2000

(30) Foreign Application Priority Data

Nov. 18, 1999 (JP) ............................................. 11-328223

(51) Int. Cl.[7] .............................. H01S 5/00; H01S 3/03; H01L 33/00
(52) U.S. Cl. ............................. 372/43; 372/46; 372/64; 257/103; 257/615; 257/14
(58) Field of Search ............................. 372/43, 64, 46; 257/103, 615, 14

(56) References Cited

U.S. PATENT DOCUMENTS

| 5,815,615 A | * | 9/1998 | Taneya et al. | 358/50 |
|---|---|---|---|---|
| 5,923,691 A | * | 7/1999 | Sato | 372/46 |
| 6,046,096 A | * | 4/2000 | Ouchi | 438/510 |
| 6,201,825 B1 | * | 3/2001 | Sakurai et al. | 372/96 |
| 6,207,973 B1 | * | 3/2001 | Sato et al. | 257/98 |
| 6,314,115 B1 | * | 11/2001 | Delfyett et al. | 372/6 |
| 6,359,920 B1 | * | 3/2002 | Jewell et al. | 372/46 |

FOREIGN PATENT DOCUMENTS

| JP | 6-37355 | 2/1994 |
|---|---|---|
| JP | 7-154023 | 6/1995 |
| JP | 9-328357 | 12/1997 |

* cited by examiner

Primary Examiner—Eddie Lee
Assistant Examiner—Joseph Nguyen
(74) Attorney, Agent, or Firm—Smith, Gambrell & Russell, LLP

(57) ABSTRACT

The semiconductor optical device is provided with an optical waveguide part and an optical amplification part respectively provided on the GaAs semiconductor substrate. The optical amplification part includes at least one semiconductor optical amplifier. The optical waveguide part includes optical elements including optical waveguides. The optical waveguides are optically connected to the semiconductor optical amplifier. The semiconductor optical amplifier is provided with an active layer including a $Ga_xIn_{1-x}N_yAs_{1-y}$ semiconductor, a first conductive type clad layer and a second conductive type clad layer respectively with the active layer between them. The optical waveguides are respectively provided with a core semiconductor layer including at least either of a GaInNAs semiconductor or a GaAs semiconductor, a first clad semiconductor layer and a second clad semiconductor layer respectively with the core semiconductor layer between them.

14 Claims, 15 Drawing Sheets

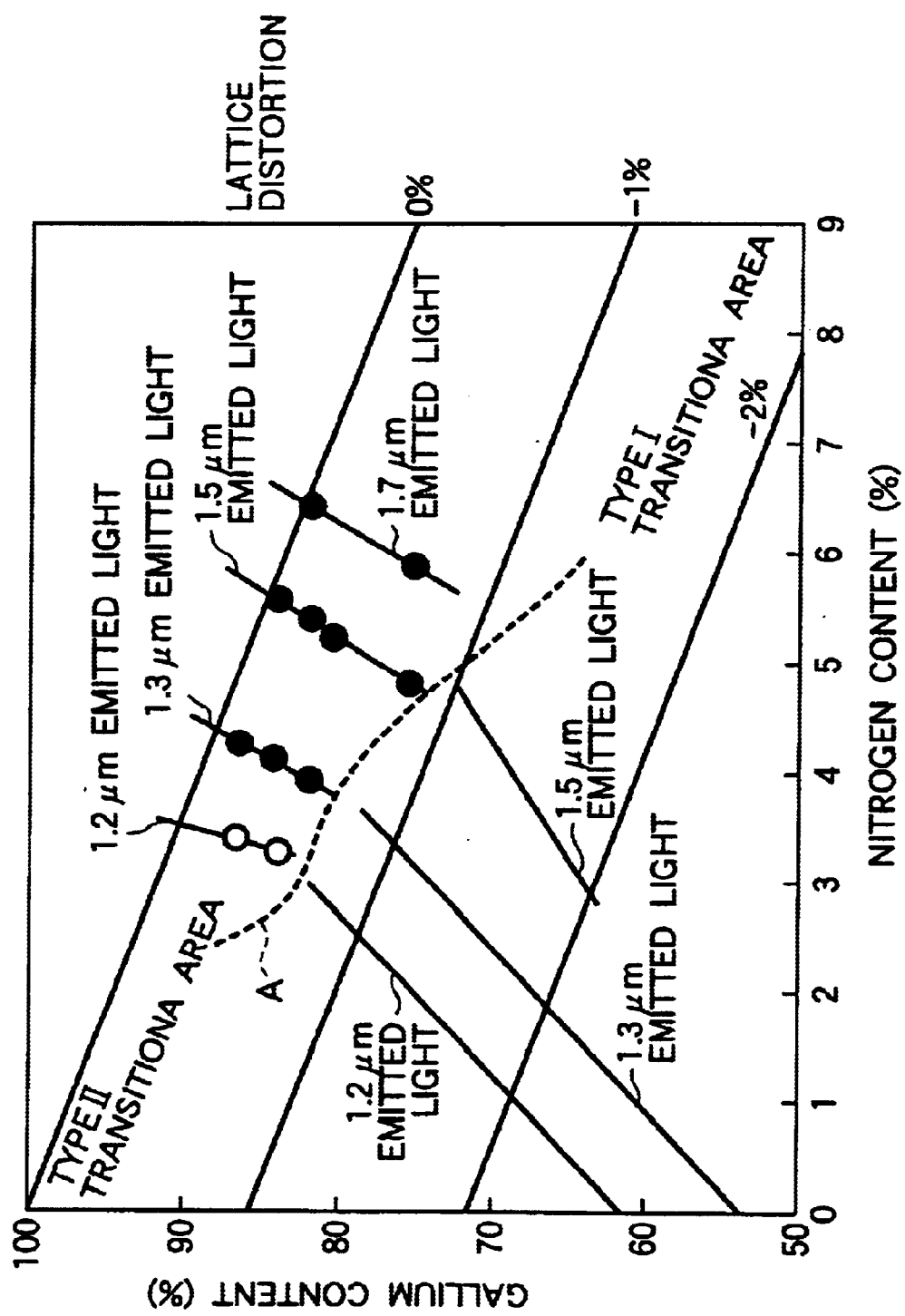

SEMICONDUCTOR OPTICAL DEVICE AND METHOD OF MANUFACTURING THE SAME

BACKGROUND OF THE INVENTION

1. Field of the Invention

The present invention relates to a semiconductor optical device including a $Ga_xIn_{1-x}N_yAs_{1-y}$ semiconductor and a method of manufacturing the same.

2. Description of the Related Art

It is known to utilize a semiconductor layer formed on a semiconductor substrate for an optical waveguide. A device wherein a semiconductor optical amplifier using an InGaAsP active layer and an optical waveguide using InGaAsP for a core are integrated on an InP substrate, which is used in a network using light having the wavelength of 1.25 to 1.65 μm suitable for transmission on an optical fiber is also known.

The emission wavelength of a semiconductor laser and a semiconductor optical amplifier respectively adopting an InP semiconductor can be varied so that it covers a range of 1.25 to 1.65 μm. An optical device wherein optical elements such as a semiconductor optical amplifier and a diffraction grating are integrated on a single InP semiconductor substrate can be produced.

As a result of the review of such an optical device, the inventors discovered the following problems.

To integrate optical elements such as a semiconductor optical amplifier and a diffraction grating on a single semiconductor substrate, large area is required. However, it is technically difficult to manufacture a fine InP semiconductor wafer having a large aperture and suitable for an integrated circuit. Also, to manufacture an InP semiconductor substrate, high-priced material is required to be used.

In the meantime, when the application of optical communication is considered to be enlarged in future, a low-priced wafer and a wafer suitable for large scale integration are required more and more. Therefore, it becomes important to select low-priced semiconductor material of which a wafer suitable for large scale integration can be manufactured.

These inventors think that for such a semiconductor substrate, a GaAs semiconductor substrate is the most suitable.

However, when a GaAs semiconductor substrate is adopted, it next becomes important to select semiconductor material suitable for integrating optical elements such as a luminous element, an optical waveguide and a diffraction grating on the substrate. Then, these inventors researched on such semiconductor material. As a result, the following some documents found.

For a document related to a semiconductor laser, Japanese Patent Unexamined Publication No. Hei. 7-154023 can be given. In the document 1, an invention made to solve a problem that it is difficult to form a semiconductor laser having high characteristic temperature for irradiating a laser beam having the wavelength of 1.3 μm on an InP substrate is disclosed. To solve the problem, in the document 1, a semiconductor laser provided with a GaAs semiconductor substrate and a GaInNAs semiconductor active layer the composition of nitrogen (N) of which is 0.5% or more on the substrate is disclosed. The oscillation wavelength of 1.3 μm of the semiconductor laser is acquired in a state in which the compressive strain quantity of a distorted GaInAsN layer does not exceed 2% because nitrogen is mixedly crystallized. However, in this invention, there is no description of a problem when plural different optical elements are integrated on a single substrate.

Also, for such a document, Japanese Patent Unexamined Publication No. Hei. 6-37355 can be given. In this document 2, an invention made to provide new semiconductor material that can oscillate a laser beam of a short wavelength is disclosed. It is described that it is possible to provide a semiconductor laser that can continuously oscillate a laser beam of a wavelength in a range of 0.35 to 1.2 μm in case where a GaAsN semiconductor is adopted for material to achieve the object is enabled. Also, in this document, a GaInNAs semiconductor is described. According to this description, the GaInNAs semiconductor can relieve the mismatching in a lattice constant with the GaAs semiconductor. There is also only description that a luminous element of a longer wavelength than that of the GaAs semiconductor can be produced. However, there is no description of acquiring a long wave the wavelength of which exceeds 1.2 μm. Also, in this invention, there is no suggestion of the problem when plural different optical elements are integrated on a single substrate.

Further, for such a document, Japanese Patent Unexamined Publication No. Hei. 9-328357 can be given. In this document 3, an invention made to form a mixed crystalline semiconductor in Families III to V of large composition of nitrogen to have high quality without enhancing the hole density of Family V is disclosed. To achieve such an object, a method of manufacturing a GaInNAs semiconductor according to a predetermined procedure is disclosed. However, there is no description of structure suitable for integrating optical elements required in a future optical communication network such as a luminous element, an optical waveguide and a diffraction grating. Also, there is no concrete and systematic description of a GaInNAs semiconductor that can be used in an optical integrated circuit including such an optical element and can be applied in a range of wavelengths from 1.25 to 1.65 μm.

Particularly, in these documents, there is no description of applying the GaInNAs semiconductor to a luminous element and adopting the GaInNAs semiconductor for an optical waveguide on which light related to this luminous element is transmitted.

SUMMARY OF THE INVENTION

Then, a first object of the present invention is to provide a semiconductor optical device wherein a luminous element, an optical waveguide and an optical element are integrated on a GaAs semiconductor substrate.

A second object of the present invention is to provide a method of manufacturing the semiconductor optical device.

The semiconductor optical device according to the invention is provided with a GaAs semiconductor substrate, an optical waveguide part provided on the GaAs semiconductor substrate and an optical amplification part provided on the GaAs semiconductor substrate. The optical amplification part includes at least one semiconductor optical amplifier. The optical waveguide is optically connected to the semiconductor optical amplifier.

The semiconductor optical amplifier is provided with an active layer including a $Ga_xIn_{1-x}N_yAs_{1-y}$ semiconductor, a first conductive-type clad layer and a second conductive-type clad layer respectively having the active layer between them. The active layer has a refractive index larger than that of the first conductive-type clad layer and that of the second conductive-type clad layer.

The optical waveguide is composed of a core semiconductor layer including at least either of a GaInNAs semiconductor or a GaAs semiconductor, first and second clad semiconductor layers respectively having the core semiconductor layer between them.

The optical element can include an optical multiplexer having plural input ports and at least one output for example. The input ports can be optically connected to the semiconductor optical amplifier. Also, the optical element can include an optical demultiplexer having at least one input port and plural output ports for example. The output ports can be optically connected to the semiconductor optical amplifier. The optical waveguide part can include an optical multiplexer and an optical demultiplexer respectively having an optical waveguide. Each optical multiplexer and each optical demultiplexer can include AWG for example.

In case the core semiconductor layer includes a GaInNAs semiconductor, the GaInNAs semiconductor has a band gap larger than energy for the wavelength of light to be amplified in the optical amplification part. Therefore, absorption in the optical waveguide part is reduced and both light to be amplified in the optical amplification part and light amplified in the optical amplification part can be propagated in the core semiconductor layer. Also, the core semiconductor layer is in contact with the active layer. Therefore, the optical waveguide and the semiconductor optical amplifier can be optically coupled without loss that may be caused by having an air layer between them.

As described above, as the GaAs semiconductor substrate is adopted, optical elements can be integrated on the fine substrate having a large aperture. Therefore, when plural optical elements such as the optical demultiplexer and/or the optical multiplexer and the semiconductor optical amplifier are integrated, an optical element the relative precision of which is equal not only for the composition of the material but for the worked form of the optical waveguide is acquired. Also, as the active layer is made of a $Ga_xIn_{1-x}N_yAs_{1-y}$ semiconductor and each of the optical multiplexer and the optical demultiplexer is provided with the optical waveguide including at least either of a GaInNAs semiconductor or a GaAs semiconductor, light of a wavelength in a wide range can be treated by combining materials of suitable composition.

The optical demultiplexer can demultiplex received light every light to be input to the semiconductor optical amplifier. The semiconductor optical amplifier can amplify the received light or can be operated as a gate. The optical multiplexer can multiplex light processed in the semiconductor optical amplifier.

In the semiconductor optical device according to the invention, the optical demultiplexer can include an arrayed waveguide grating (AWG) and the optical multiplexer can also include AWG. In case the optical demultiplexer includes AWG, light received via the input port of AWG can be demultiplexed into plural output ports provided in spatially different positions every wavelength. Also, in case the optical multiplexer includes AWG, light different in a wavelength received via the plural input ports in spatially different positions can be multiplexed into a single output port.

In the semiconductor optical device according to the invention, for the $Ga_xIn_{1-x}N_yAs_{1-y}$ semiconductor of the active layer, it is possible that $0.7 \leq x \leq 0.9$ and $0.03 \leq y \leq 0.1$.

The semiconductor of such composition is suitable for a bulk active layer having no quantum well (QW) structure. Hereby, these inventors found that light of energy for a band gap of the $Ga_xIn_{1-x}N_yAs_{1-y}$ semiconductor layer adopted as the material of the active layer was generated by controlling the composition in the range.

In the semiconductor optical device according to the invention, the active layer can be provided at least one quantum well layer including a $Ga_xIn_{1-x}N_yAs_{1-y}$ semiconductor and plural quantum barrier layers provided with the quantum well layer between them.

In the semiconductor optical device according to the invention, the quantum barrier layer includes a GaAs semiconductor and for the $Ga_xIn_{1-x}N_yAs_{1-y}$ semiconductor of the quantum well layer, it is possible that x is substantially 0.65, preferably $0.62 \leq x \leq 0.68$ and $0.005 \leq y \leq 0.04$.

The semiconductor of such composition is suitable for an active layer having single quantum well (SQW) structure or multiple quantum well (MQW) structure. These inventors found that in such a range of composition, the mismatching of approximately 2% with a grating was applied between a $Ga_xIn_{1-x}N_yAs_{1-y}$ semiconductor in the quantum well layer and a GaAs semiconductor, and light of energy corresponding to difference in a level between quantums in a conduction band or in a valence band according to the band cap or quantum well structure was amplified by controlling the composition of the $Ga_xIn_{1-x}N_yAs_{1-y}$ semiconductor layer adopted as the material of the quantum well layer in the range described above.

In the semiconductor optical device according to the invention, the quantum barrier layer includes an AlGaAs semiconductor and for the $Ga_xIn_{1-x}N_yAs_{1-y}$ semiconductor of the quantum well layer, it is possible that $0.7 \leq x \leq 0.87$ and $0.035 \leq y \leq 0.1$.

The semiconductor of such composition is suitable for an active layer having SQW structure or MQW structure. These inventors found that in such a range of composition, matching with a grating was substantially achieved for an AlGaAs semiconductor in the quantum barrier layer, and light of energy according to the band cap and the quantum well structure of the $Ga_xIn_{1-x}N_yAs_{1-y}$ semiconductor layer adopted as the material of the quantum well layer was amplified.

In the semiconductor optical device according to the invention, the quantum barrier layer can include at least either of a GaInAs semiconductor or a GaAs semiconductor. For the $Ga_xIn_{1-x}N_yAs_{1-y}$ semiconductor of the quantum well layer, it is possible that $0.7 \leq x \leq 0.9$ and $0.035 \leq y \leq 0.06$.

The semiconductor of such composition is suitable for an active layer having SQW structure or MQW structure. These inventors found that in such a range of composition, so-called type II of quantum well structure was achieved. These inventors found that light of energy according to difference in energy between the conductive layer of the $Ga_xIn_{1-x}N_yAs_{1-y}$ semiconductor layer adopted as the material of the quantum well layer and the valence band of the quantum barrier layer, and according to quantum well structure was generated.

To manufacture the semiconductor optical device described so far and a semiconductor optical device to be described after this, the following methods can be applied.

A method of manufacturing the semiconductor optical device according to the invention is composed of (1) a step for preparing a GaAs semiconductor substrate provided with a first area and a second area on its principal plane, (2) a step for forming an optical amplification part provided with a first conductive type clad layer, an active layer including a $Ga_xIn_{1-x}N_yAs_{1-y}$ semiconductor and a second conductive type clad layer in the first area on the GaAs semiconductor substrate and (3) a step for forming an optical element including an optical waveguide provided with a first clad semiconductor layer, a core semiconductor layer including at least either of a GaInNAs semiconductor having a band gap larger than the $Ga_xIn_{1-x}N_yAs_{1-y}$ semiconductor or a GaAs semiconductor and a second clad semiconductor layer in the second area on the GaAs semiconductor substrate.

As optical elements such as the optical amplification part, the optical multiplexer and the optical demultiplexer are formed in separate areas, the composition of the active layer film in the optical amplification part and the composition of the core semiconductor film of the optical waveguide included in the optical element can be independently controlled.

Also, as the semiconductor optical amplifier and the optical waveguide are formed on the same substrate, relative precision in the arrangement of the semiconductor optical amplifier and the optical waveguide is high. As the materials and a process of the formation are same in case the optical element includes the optical multiplexer and the optical demultiplexer, the relative precision of the shape is also high.

Further, in case a GaInNAs semiconductor is adopted, light of various wavelengths can be managed only by varying the composition. Therefore, a semiconductor optical device that can manage light of various wavelengths, keeping predetermined relation with the lattice constant of a GaAs semiconductor is provided.

In the method of manufacturing the semiconductor optical device according to the invention, the step (2) described above may be also composed of (2a) a substep for sequentially forming a first conductive type clad film, an active layer film including a $Ga_xIn_{1-x}N_yAs_{1-y}$ semiconductor and a second conductive type clad film on the GaAs semiconductor substrate and (2b) a substep for etching the first conductive type clad film, the active layer film and the second conductive type clad film and forming a first conductive type clad layer, an active layer and a second conductive type clad layer in the first area.

In the method of manufacturing the semiconductor optical device according to the invention, the step (3) described above may be also composed of (3a) a substep for sequentially forming a first clad semiconductor film, a core semiconductor film including at least either of a GaInNAs semiconductor having a band gap larger than a $Ga_xIn_{1-x}N_yAs_{1-y}$ semiconductor or a GaAs semiconductor and a second clad semiconductor film in the second area on the GaAs semiconductor substrate and (3b) a substep for etching the first clad semiconductor film, the core semiconductor film and the second clad semiconductor film to form an optical waveguide including a first clad semiconductor layer, a core semiconductor layer and a second clad semiconductor layer and forming an optical multiplexer and an optical demultiplexer respectively including the optical waveguide.

Also, in the method of manufacturing the semiconductor optical device according to the invention, the step (3) described above may also include (3c) a substep for sequentially forming a first clad semiconductor layer film, a core semiconductor layer film including at least either of a GaInNAs semiconductor having a band gap larger than a $Ga_xIn_{1-x}N_yAs_{1-y}$ semiconductor or a GaAs semiconductor and a second clad semiconductor layer film in the second area on the GaAs semiconductor substrate and (3d) a substep for etching the first clad semiconductor layer film and the core semiconductor layer film to form an optical waveguide including a first clad semiconductor layer, a core semiconductor layer and a second semiconductor layer, at least etching the first conductive type clad layer and forming an optical multiplexer and an optical demultiplexer.

Further, in the invention related to the method of manufacturing the semiconductor optical device, the core semiconductor layer is formed so that it is in contact with the active layer. Also, the first and second clad semiconductor layer films are formed so that they have the core semiconductor layer film between them.

According to the method composed of the steps described above, as the active layer and the core semiconductor layer can be connected in the manufacturing process of the semiconductor optical device in managed environment, loss in coupling can be optically reduced.

BRIEF DESCRIPTION OF THE DRAWINGS

FIG. 20 shows the composition of the GaInNAs semiconductor.

DETAILED DESCRIPTION OF THE PREFERRED EMBODIMENTS

Figure 1:
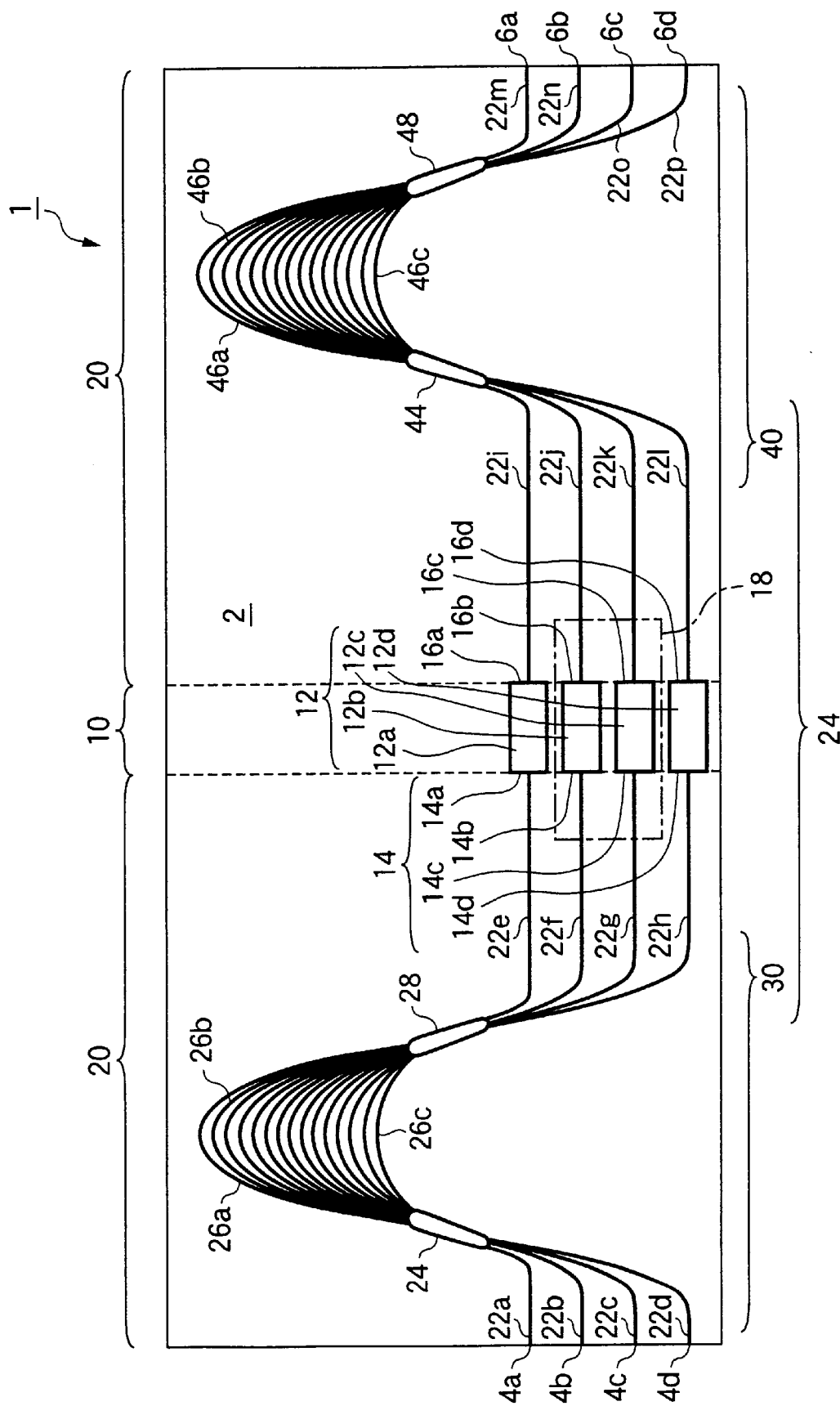
FIG. 1 is an showing a semiconductor optical device equivalent to an embodiment of the invention.

Referring to the drawings, an embodiment of the invention will be described below. The same reference number is allocated to the same part in the drawings if possible.

FIG. 1 is a plan showing a semiconductor optical device equivalent to an embodiment of the invention. The semiconductor optical device 1 is provided with a GaAs semiconductor substrate 2, an optical amplification part 10 provided on the substrate 2 and an optical waveguide part 20 provided on the substrate 2. The semiconductor optical device 1 is provided with single or plural inputs 4 (4a to 4d) and single or plural outputs 6 (6a to 6d). The inputs 4 (4a to 4d) are provided to provide received light to at least either of the optical amplifier 10 or the optical waveguide 20. The outputs 6 (6a to 6d) are provided to provide light from at least either of the optical amplifier 10 or the optical waveguide 20 to an external device. The inputs 4 (4a to 4d) and the outputs 6 (6a to 6d) can be respectively optically connected to an optical transmission line such as an optical fiber.

The optical amplification part 10 includes a single or plural semiconductor optical amplifiers 12 that emit light when a carrier is injected. The semiconductor optical amplifier 12 is provided with a pair of ports 14 and 16 via which light can be input and be output. An active layer that amplifies light by stimulated emission when the active layer receives light is provided between the input port 14 and the output port 16. The active layer is made of a compound semiconductor in Families III to V. In FIG. 1, four semiconductor optical amplifiers 12a, 12b, 12c and 12d are respectively provided with the input ports 14a, 14b, 14c and 14d and the output ports 16a, 16b, 16c and 16d. For example, when the semiconductor optical amplifier 12a is powered, it amplifies light of a predetermined wavelength received via the input port 14a and provides it to the output port 16a. Optical coupling loss between a fiber and each input port 4a to 4d and between each output port 6a to 6d and the fiber and optical loss inside the optical waveguide can be compensated by the effect of the amplification. When the semiconductor optical amplifier 12a is not powered, it attenuates light of a predetermined wavelength received via the input port 14a up to the output port 16a.

The optical waveguide part 20 includes optical waveguides 22 (22a to 22p) optically connected to at least either of the input port 14 or the output port 16 of the semiconductor optical amplifier 12. Although the optical waveguide 20 is made of a compound semiconductor in Families III to V, the band gap is larger than that of the compound semiconductor in Families III to V which is the material of the active layer. Therefore, light input to the semiconductor optical amplifier 10 can be transmitted in the optical waveguide 22. Therefore, in the semiconductor optical device 1 equivalent to this embodiment of typical size, for example 3 to 4 mm in the length and 5 to 7 mm in the breadth, light is propagated without being mostly attenuated.

To provide the optical waveguide 22 made of a compound semiconductor in Families III to V on such a semiconductor substrate 2, microprocessing technology in semiconductor manufacturing technology can be adopted. The optical waveguide 22 of the width of approximately a few micrometers can be formed by the application of this technology, the processing precision is also very high and the reproducibility in a working dimension is also practical enough.

In addition, the optical waveguide 22 confines light by laminating semiconductor layers different in a refractive index in a direction perpendicular to the surface of the substrate 2, is formed by partially removing the laminated semiconductor layers in a direction along the surface of the substrate 2, and can confine light utilizing the difference in a refractive index between the semiconductor layer and air. Optical connection with the active layer of the semiconductor optical amplifier 12 is also achieved in a state in which the loss is equal to or below loss practically allowable.

The contour of the optical waveguide 22 can be also defined in a range of allowable optical loss by applying microprocessing technology. Therefore, optical elements 30 and 40 can be formed by combining the connection of plural optical waveguides different in optical distance or the connection of plural optical waveguides different in width.

Referring to FIG. 1, the optical demultiplexer 30 is provided with first and second slab waveguides 24 and 28 and plural optical waveguides 26a, 26b and 26c provided between the first slab waveguide 24 and the second slab waveguide 28. The first slab waveguide 24 is connected to the optical waveguides 22a to 22d so that light to be demultiplexed by this is provided. The second slab waveguide 28 is connected to the optical waveguides 22e to 22h so that light demultiplexed by this is received. The optical waveguides 22a to 22d can be respectively connected to the inputs 4a to 4d. The plural optical waveguides 26a, 26b and 26c respectively have optical path length different by a predetermined length $\Delta L$.

In the optical demultiplexer 30, light of plural wavelength components input to the slab waveguide 24 from any of the optical waveguides 22a to 22d is propagated in the slab waveguide 24 and reaches each one end of the plural optical waveguides 26a, 26b and 26c. Light that reaches each other end of the plural optical waveguides 26a, 26b and 26c is propagated in the slab waveguide 28. As the optical waveguides 26a, 26b and 26c are different in optical length by $\Delta L$, light from each optical waveguide 26a to 26c interfere with one another in the slab wave guide 28 and intensifies one another in a position different according to each wavelength. In case each one end of the optical waveguides 22e to 22h is arranged in the corresponding position every wavelength, an optical signal including plural wavelength components can be demultiplexed every wavelength component.

The optical multiplexer 40 is provided with third and fourth slab waveguides 44 and 48 and plural optical waveguides 46a, 46b and 46c provided between the third slab waveguide 44 and the fourth slab waveguide 48. The third slab waveguide 44 is connected to the optical waveguides 22i to 22l so that light to be multiplexed by this is provided. The fourth slab waveguide 48 is connected to the optical waveguides 22m to 22p so that light multiplexed by this is received. The optical waveguides 22m to 22p can be respectively connected to the outputs 6a to 6d. The plural optical waveguides 46a, 46b and 46c respectively have optical length different by a predetermined length $\Delta L$.

In the optical multiplexer 40, light different in a wavelength and having a single wavelength component is input to the optical waveguides 22i to 22l. This light is propagated in the slab waveguide 44 and reaches each one end of plural optical waveguides 46a, 46b and 46c. The light that reaches each other end of the plural optical waveguides 46a, 46b and 46c is propagated in the slab waveguide 48. In the slab waveguide 48, light from each optical waveguide 46a to 46c interferes with one another. As the optical waveguides 46a, 46b and 46c are different in optical length by $\Delta L$, light of all wavelengths intensifies one another in the same position. Hereby, as the light is output to any of the optical waveguides 22m to 22p, light of plural wavelengths can be multiplexed. It is determined depending upon the combination of wavelengths input to the optical waveguides 22i to 22l to which of the optical waveguides 22m to 22p the light is output.

Figure 2:
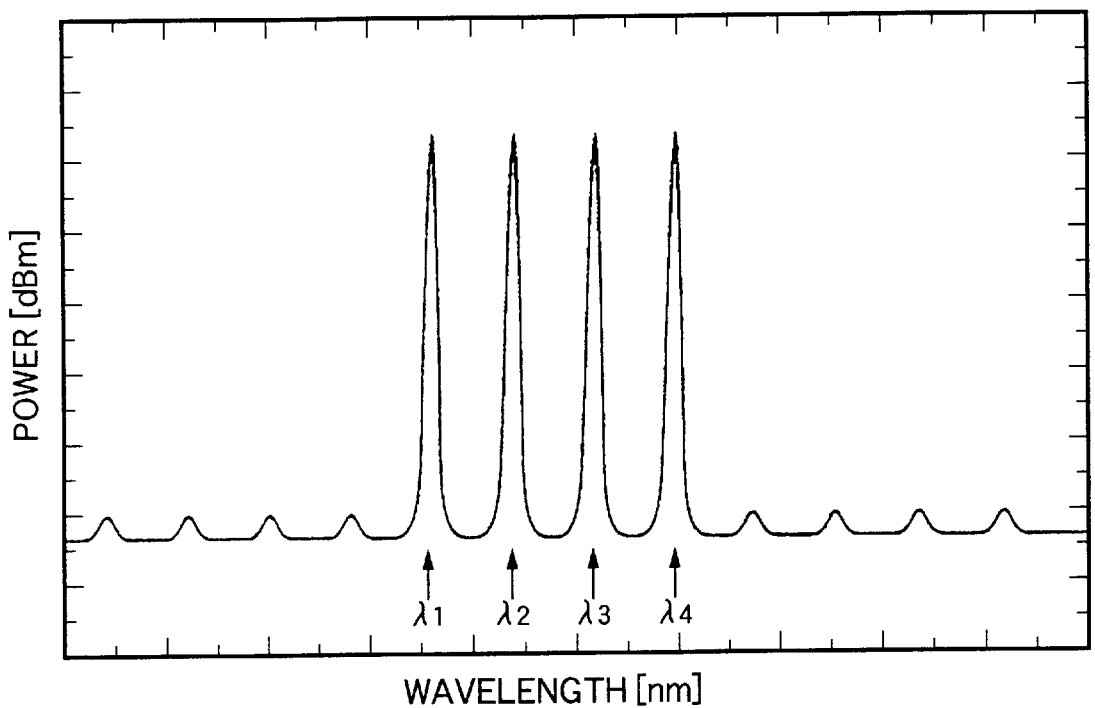
FIG. 2 is an explanatory drawing for explaining the operation of the semiconductor optical device shown in FIG. 1.
Figure 3:
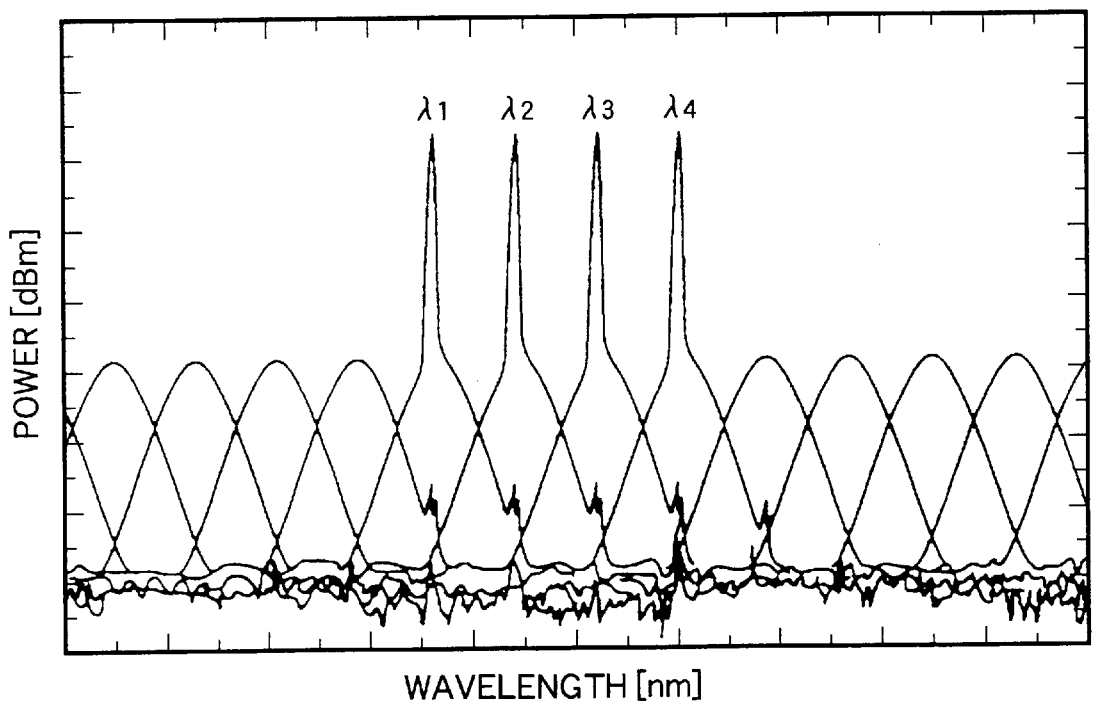
FIG. 3 is an explanatory drawing for explaining the operation of the semiconductor optical device shown in FIG. 1.

FIGS. 2 and 3 are explanatory drawings for explaining the operation of the semiconductor optical device 1 shown in FIG. 1. In FIG. 2, an optical signal including one or plural (four in an example shown in FIG. 2) wavelength components input to the semiconductor optical device 1 is shown. When the semiconductor optical device 1 receives such an optical signal from a predetermined input channel, the optical signal is demultiplexed every wavelength in an optical demultiplexer such as AWG. Either (the amplification in the example shown in FIG. 3) of the amplification or the attenuation is applied to demultiplexed light of each wavelength in the respective semiconductor optical amplifiers to which the light is input. After this processing, each light is multiplexed in an optical multiplexer such as AWG and a waveform shown in FIG. 3 is provided to a predetermined output channel.

Next, a method of manufacturing the optical waveguide 22 and the semiconductor optical amplifier 10 will be described. Hereby, the structure of the optical waveguide 22 and the semiconductor optical amplifier 10 can be also understood. FIGS. 4 to 12 show manufacturing process drawings. These drawings show a part encircled by an alternate long and short dash line in FIG. 1. Therefore, though the side extended in the direction of the x-axis and in the direction of the y-axis is shown in FIGS. 4 to 12 referred in the description, these sides show the section in the manufacturing process of the semiconductor optical device equivalent to this embodiment.

Figure 4:
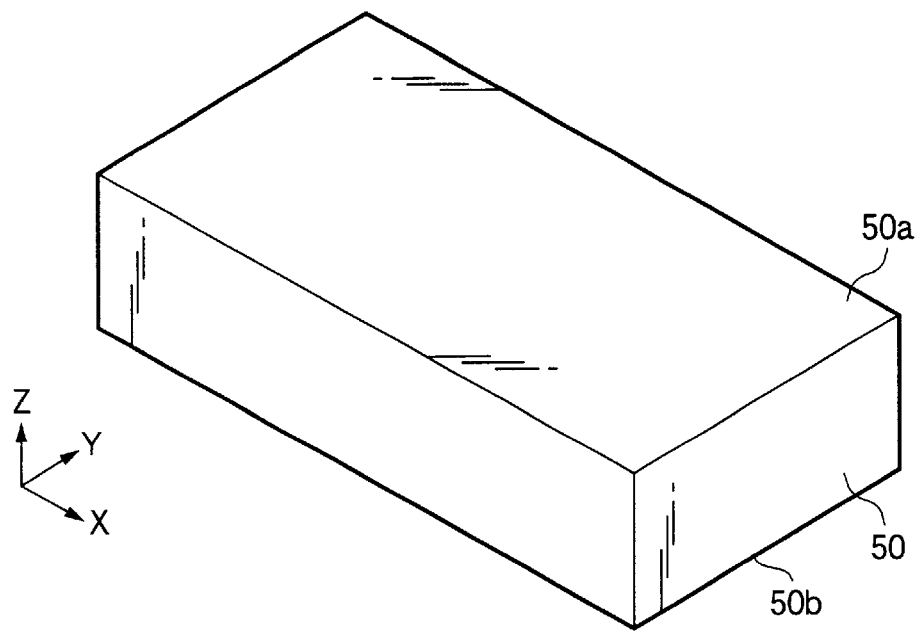
FIG. 4 shows the manufacturing process of the semiconductor optical device equivalent to this embodiment.

First, an n-type GaAs semiconductor substrate 50 shown in FIG. 4 is prepared. As the GaAs semiconductor substrate 50 is adopted as described above, optical elements can be integrated on the fine substrate having a large aperture. The GaAs semiconductor substrate 50 has a principal plane 50a and the back 50b opposite to the principal plane 50a. A p-type GaAs semiconductor substrate may be also adopted in place of the n-type GaAs semiconductor substrate 50. For the crystal plane of the substrate, a plane (001) is adopted, however, a substrate tilted in the direction of [110] at an angle in a range between 2° and 25° from the plane can be also used. The consumed quantity of nitrogen in the growth of a semiconductor can be reduced by adopting such a tilted substrate.

A first clad film 52 including an n-type AlGaAs semiconductor, an active layer film 54 for SOA including an undoped GaInNAs semiconductor, a second clad film 56 including a p-type AlGaAs semiconductor and a contact film 58 including a p-type GaAs semiconductor are sequentially grown on the principal plane 50a of the substrate 50. Also, a buffer film including an n-type GaAs semiconductor can be formed prior to the growth of the first clad film 52.

Concretely, these compound semiconductor films in Families III to V are formed on the principal plane of an n-type GaAs plane (001) substrate having the carrier density of $2 \times 10^{18}$ cm$^{-3}$ using an organic metal chemical vapor deposition device adopting a horizontal type reactor made of quartz. For the material of Ga in Family III, triethylgallium (TEG) is used, for the material of In, trimethylindium (TMI) is used, for the material of N in Family V, dimethylhydrazine (DMHy) is used, for the material of As, tertiary butyl arsine (TBAs) is used and for the material of P, tertiary butyl phosphine (TBP) is used. These materials are injected into the reactor by bubbling using gaseous hydrogen as carrier gas.

In a method of forming a GaInNAs semiconductor crystal adopted for an active layer film, [TBAs]/([TEG]+[TMI]) and [DMHy]/([DMHy]+[TBAs]) respectively expressed by mole supply ratio are varied at the growth temperature of 530° C. and the ratio of the composition is regulated. The composition of nitrogen can be controlled by varying [DMHy]/([DMHy]+[TBAs]). To acquire an n-type conduction characteristic, tetraethylsilane (TESi) can be adopted as a dopant. To acquire a p-type conduction characteristic, diethylzinc (DEZn) can be adopted as a dopant.

In case these semiconductors are formed, organic metal vapor phase epitaxy (OMVPE) can be also adopted, however, the invention is not limited to this, and molecular beam epitaxy (MBE) and chemical beam epitaxy (CBE) can be adopted. For the material of N, a radical N acquired by exciting $N_2$ gas can be also used.

The carrier density and the thickness of these semiconductor films are as follows:

| Dopant density | Thickness |
| --- | --- |
| First clad film 52: Si: $7.0 \times 10^{17}$ cm$^{-3}$ | 2.0 μm |
| GaInNAs active film 54: Undoped | 0.2 μm |
| Second clad film 56: Zn: $8.0 \times 10^{17}$ cm$^{-3}$ | 2.0 μm |
| Contact film 58: Zn: $3.0 \times 10^{18}$ cm$^{-3}$ | 0.2 μm |

Hereby, the active layer film including a $Ga_xIn_{1-x}N_yAs_{1-y}$ semiconductor, the first conductive-type clad film and the second conductive-type clad film provided with the active layer film between them are formed.

Figure 5:
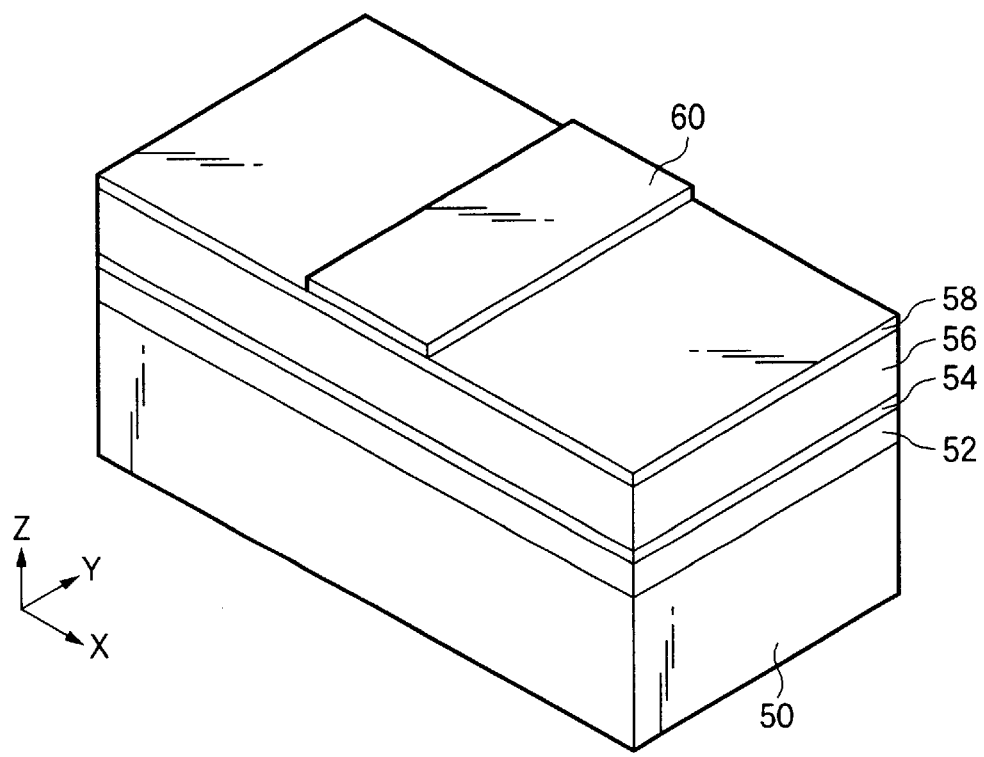
FIG. 5 shows the manufacturing process of the semiconductor optical device equivalent to this embodiment.

Next, a silicon nitride (SiN) film is formed on the contact film 58. The SiN film is etched using photolithography so that a predetermined area is left and is used as a mask. As a result, the mask SiN layer 60 is formed in an area for the optical amplification part (10 in FIG. 10) to be formed. In FIG. 5, this area is in the shape of a strip extended in the direction of the y-axis.

Figure 6:
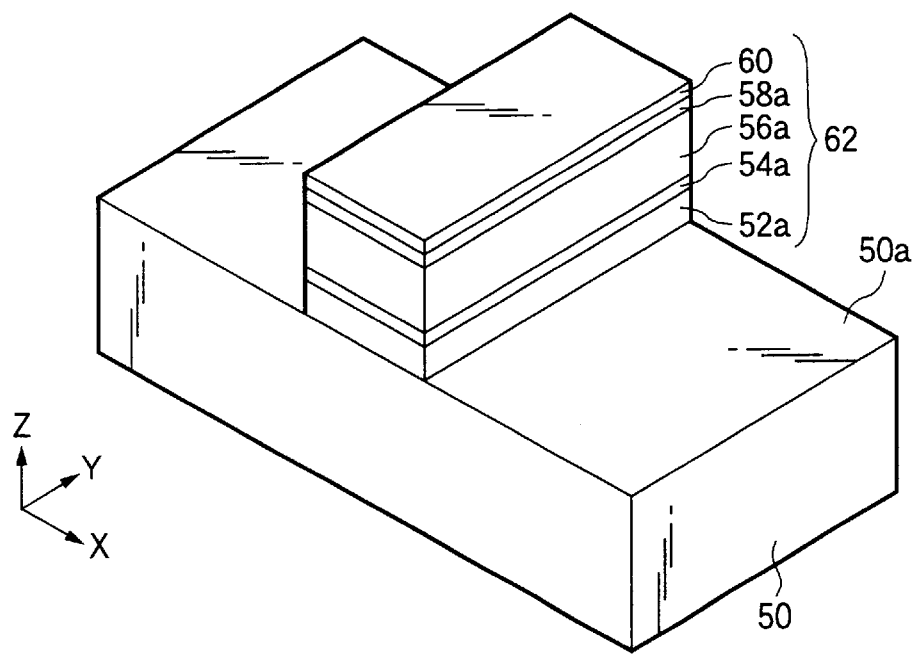
FIG. 6 shows the manufacturing process of the semiconductor optical device equivalent to this embodiment.

As shown in FIG. 6, the first clad film 52, the active layer film 54, the second clad film 56 and the contact film 58 are etched using the SiN layer 60 as a mask and a mesa 62 for the optical amplification part is formed. The mesa 62 for the optical amplification part is provided with a first clad layer 52a, an active layer 54a, a second clad layer 56a and a contact layer 58a and the SiN layer 60 exists on them. The GaAs semiconductor substrate 50 is provided with a first area in which the mesa 62 for the optical amplification part is formed and a second area different from the first area on the principal plane 50a. In the second area, the principal plane 50a of the semiconductor substrate 50 is exposed and the optical waveguide part (20 in FIG. 1) is formed here.

Figure 7:
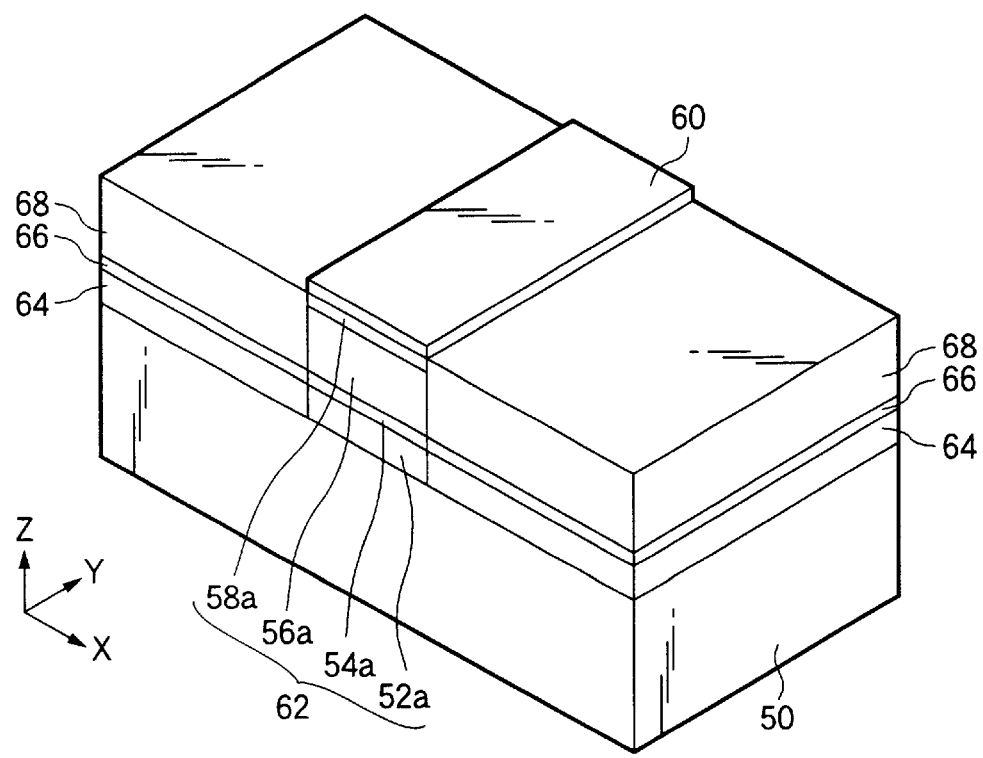
FIG. 7 shows the manufacturing process of the semiconductor optical device equivalent to this embodiment.

In a state in which the SiN layer 60 is left on the mesa 62 for the optical amplification part, a third clad film 64 including an undoped GaAs semiconductor, a core film 66 including a GaInNAs semiconductor and a fourth clad film 68 including an undoped GaAs semiconductor are deposited adopting organic metal vapor phase epitaxy. Predetermined semiconductor films are formed only in an area in which the SiN layer 60 is not provided as shown in FIG. 7, that is, the second area where the principal plane 50a of the semiconductor substrate 50 is exposed by the deposition.

The thickness of these semiconductor films is as follows:

|  | Thickness |
|---|---|
| Third clad film 64: | 1.85 μm |
| GaInNAs core film 66: | 0.50 μm |
| Fourth clad film 68: | 2.05 μm |

The optical waveguide can be provided with the core semiconductor film including a GaInNAs semiconductor, the first and second clad semiconductor films provided with the core semiconductor film between them. The third clad film 64 has the thickness in which the core semiconductor layer 66 and the active film 54 are directly connected. That is, it is desirable that the third clad film 64 has the thickness substantially equal to that of the first clad film 52.

Figure 8:
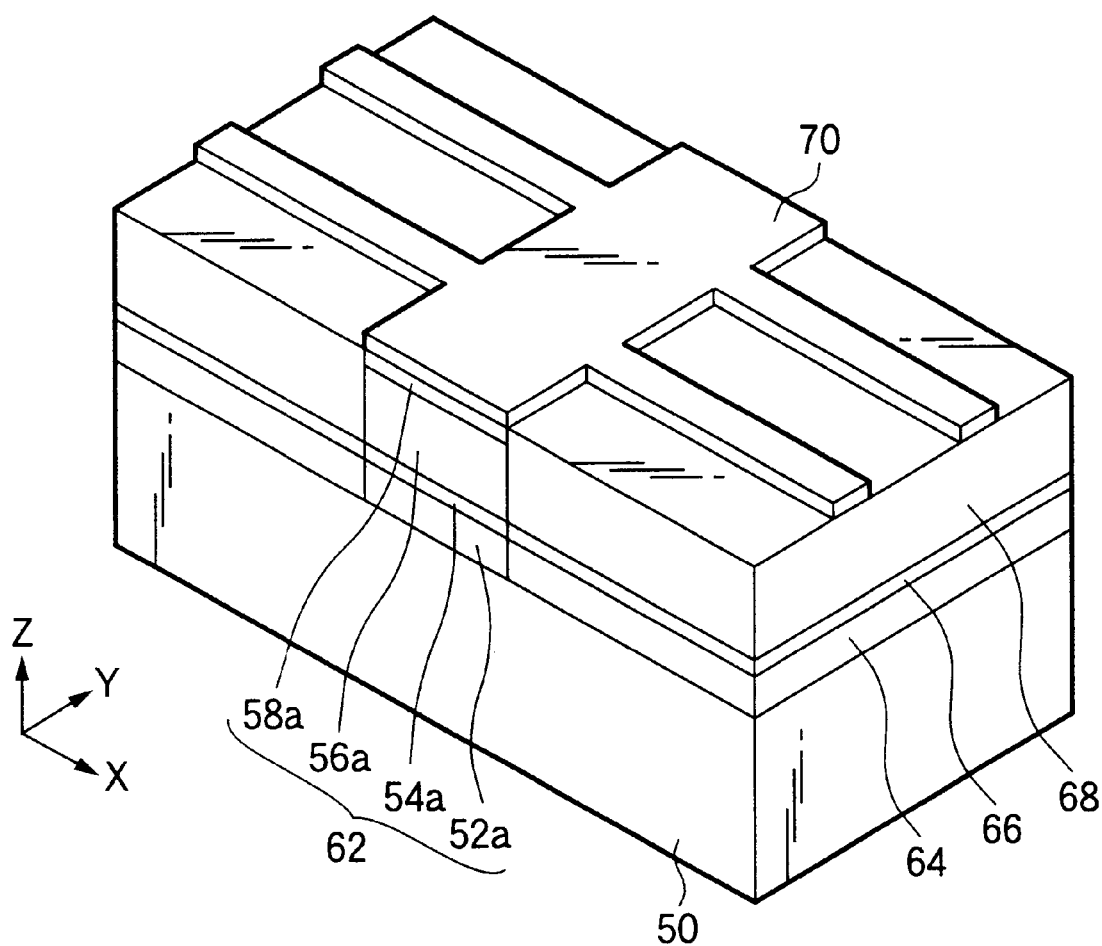
FIG. 8 shows the manufacturing process of the semiconductor optical device equivalent to this embodiment.

Next, as shown in FIG. 8, after the SiN layer 60 is removed, a mask layer 70 is formed on the semiconductor layers 64 and 66, the exposed semiconductor layer 68, the semiconductor layers 52a, 54a, 56a and the exposed semiconductor layer 58a. The mask layer is provided in an area for an optical waveguide to be formed and in an area for covering the mesa for the optical amplification part. The mask layer 70 can be formed using photolithography for example. The mask layer 70 can be also formed on the SiN layer 60 without removing the SiN layer.

Figure 9:
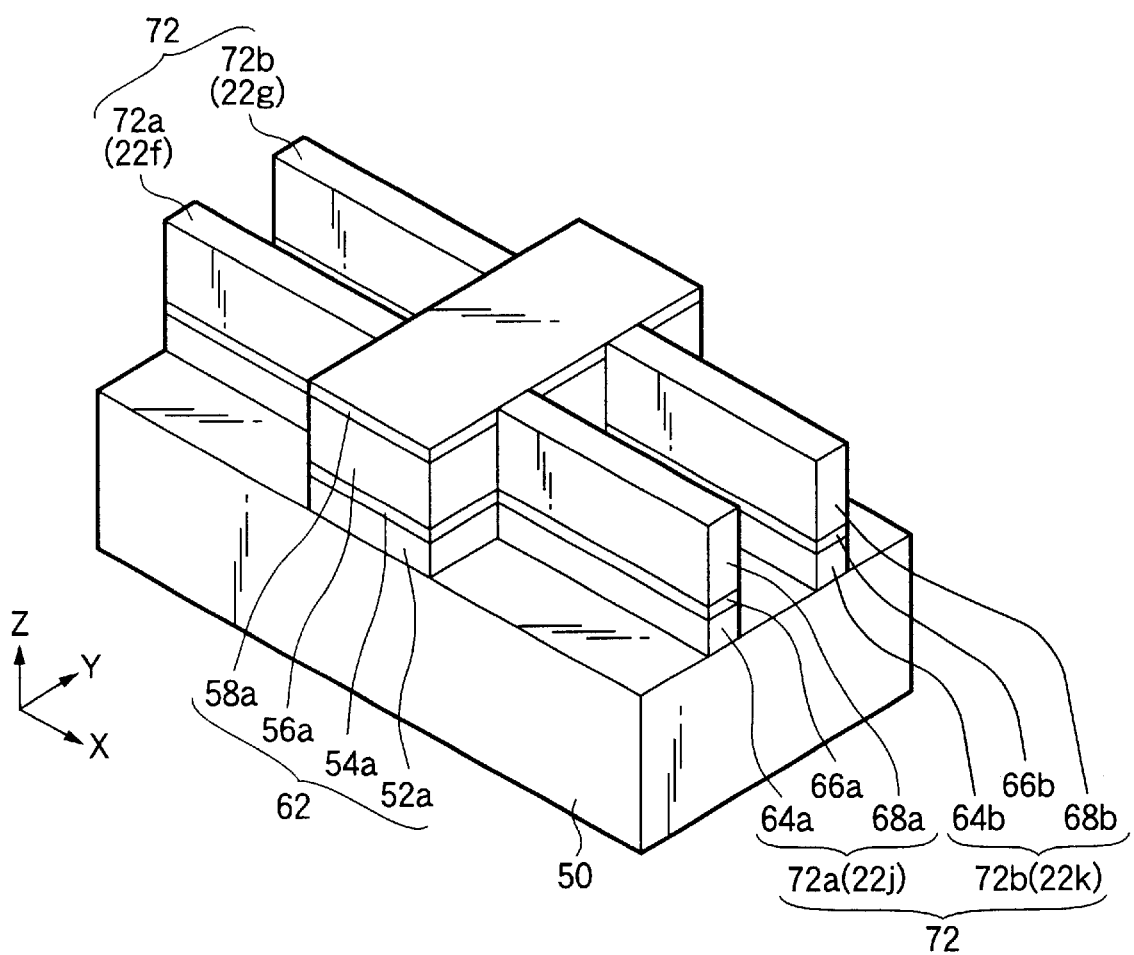
FIG. 9 shows the manufacturing process of the semiconductor optical device equivalent to this embodiment.

An optical waveguide 72 (72a and 72b) is formed by etching using the mask layer 70 as shown in FIG. 9. The optical waveguides 72a (22f and 22j in FIG. 1) and 72b (22g and 22k in FIG. 1) are respectively arranged with the optical amplification part (10 in FIG. 1) between them and are extended along a predetermined axis. The optical waveguide 72a is provided with the core semiconductor layer 66a, the third clad layer 64a and the fourth clad layer 68a provided so that light to be propagated through the core semiconductor layer 66a is confined. The optical waveguide 72b is provided the core semiconductor layer 66b, the third clad layer 64b and the fourth clad layer 68b provided so that light to be propagated through the core semiconductor layer 66b is confined. The core layers 66a and 66b are respectively directly in contact with the active layer 54a of the optical amplification part 62. Therefore, light is propagated in both directions between the core semiconductor layer 66a or 66b and the active layer 54a and connection in which loss caused in the propagation is reduced is provided. The optical waveguide provided as described above can have the width of approximately 2 μm.

Figure 10:
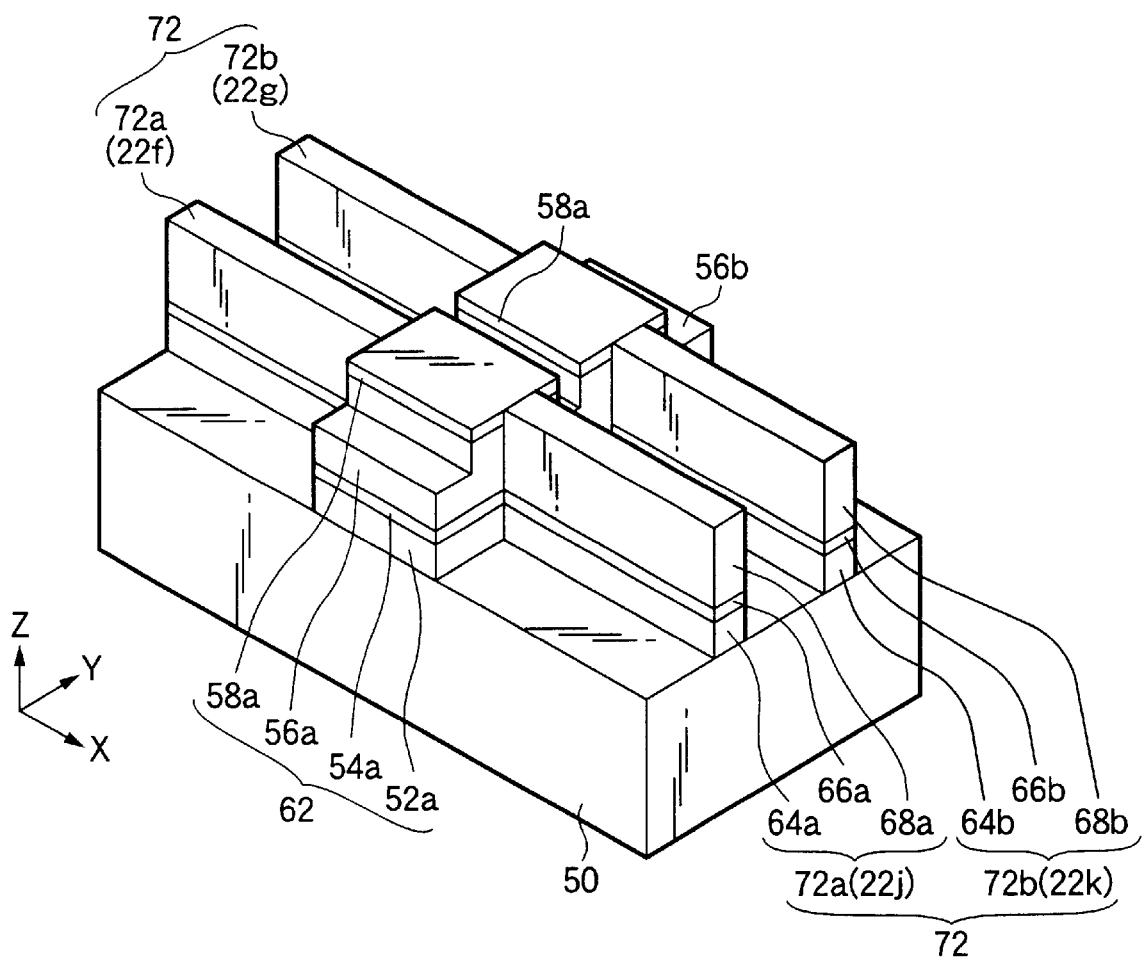
FIG. 10 shows the manufacturing process of the semiconductor optical device equivalent to this embodiment.

Afterward, the semiconductor layers 58a and 56a of the optical amplification part (10 in FIG. 1) are partially removed. Referring to FIG. 10, the removed part (the contact layer 58a and the second clad layer 56a) forms a ridge in the optical amplification part. The ridge is extended in the shape of a band along each optical waveguide 72a, 72b to be formed. Carriers injected into the active layer 54a are constricted by this ridge and the transverse confinement of light is realized.

Figure 11:
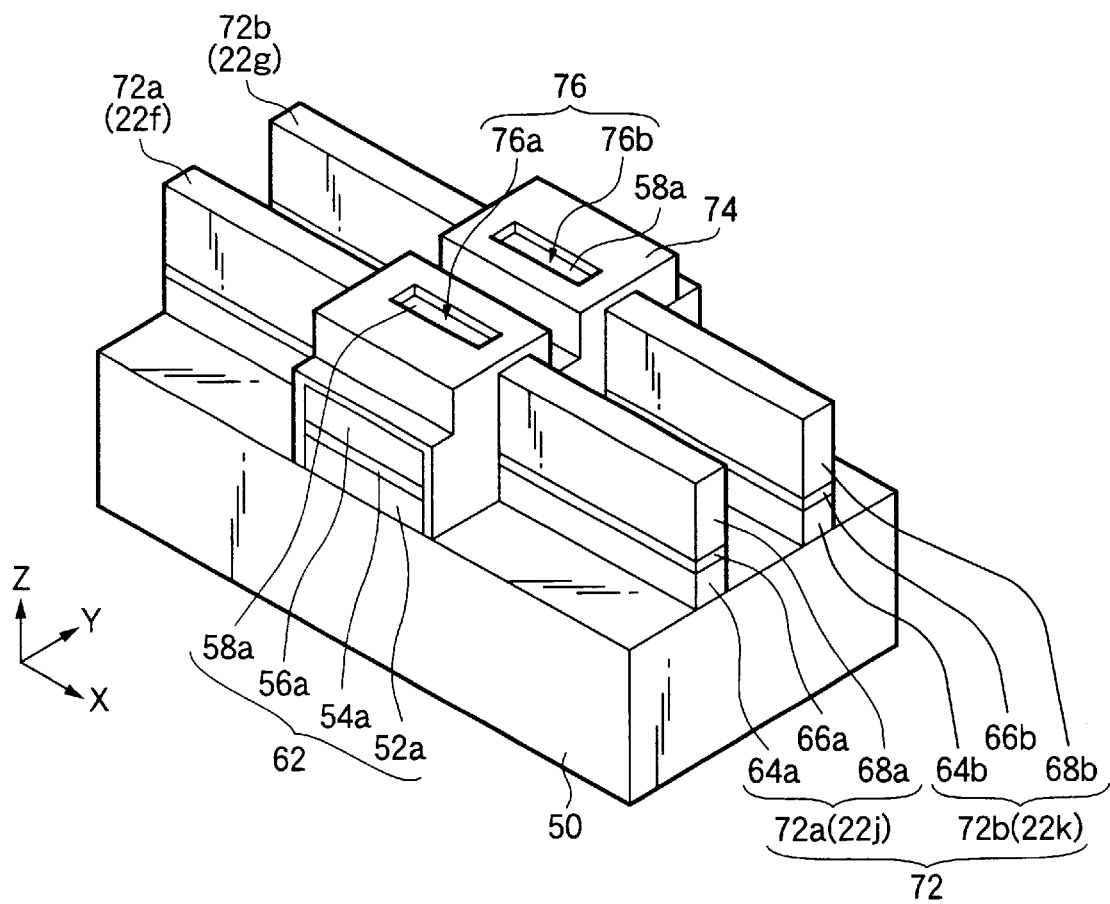
FIG. 11 shows the manufacturing process of the semiconductor optical device equivalent to this embodiment.

Next, as shown in FIG. 11, an insulating film 74 such as a silicon oxide (SiO$_2$) film is formed on the surface of the mesa 62 for the optical amplification part. No insulating film 74 is formed on the surface of the optical waveguide part. The reason is to realize the confinement of light utilizing difference in are fractive index between the semiconductor layer composing the optical waveguide and gas (air). Next, an electrode for the contact layer 58a is formed for each of the semiconductor optical amplifiers (12 in FIG. 1). First, an opening 76 is provided to the insulating film 74. The opening 76 is provided to each of the semiconductor optical amplifiers (12a to 12d in FIG. 1). The openings 76a and 76b are respectively provided along the optical waveguides 72a (22f and 22j) and 72b (22g and 22k) in the optical amplification part 62.

Figure 12:
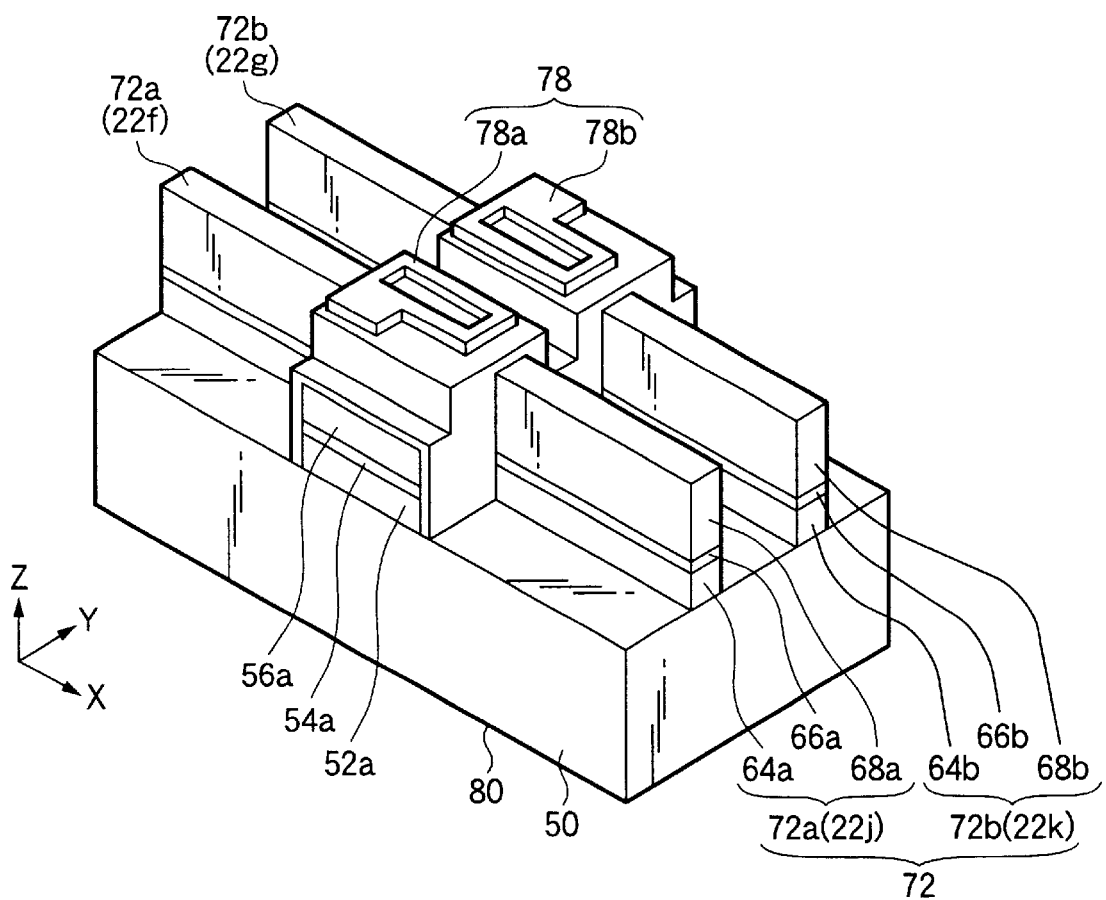
FIG. 12 shows the manufacturing process of the semiconductor optical device equivalent to this embodiment.

An electrode 78a, 78b can be provided every semiconductor optical amplifier as shown in FIG. 12. The electrode for a p-type semiconductor layer maybe composed of conductive layers made of Au, Pt or Ti for example.

An electrode 80 is also formed on the back 50b of the substrate 50. The electrode 78 is provided to supply power to a p-type area of the semiconductor optical amplifiers (12a to 12d in FIG. 1), however, the electrode 80 is provided to supply power to an n-type area of the semiconductor optical amplifiers (12a to 12d in FIG. 1). The electrode for an n-type semiconductor layer may be made of AuGeNi for example.

The electrode 80 is not provided to each of plural semiconductor optical amplifiers (12a to 12d in FIG. 1) shown in FIG. 12. However, the electrodes 78a and 78b for a p-type area are provided every semiconductor optical amplifier so that carriers to be provided to the active layer are provided to an area in which light incident from the optical waveguide passes.

An optical demultiplexer can be connected to the input of each semiconductor optical amplifier 12a to 12d so that light of different wavelengths is input to each of plural semiconductor optical amplifiers 12a to 12d in FIG. 1 provided on the substrate 50. An optical multiplexer can be connected to the output of each semiconductor optical amplifier 12a to 12d so that light of different wavelengths output from each of the plural semiconductor optical amplifiers 12a to 12d provided on the substrate 50 is multiplexed.

In this embodiment, each of plural semiconductor optical amplifiers is provided with the common third clad layer 52a, the active layer 54a, the fourth clad layer 56a and the contact layer 58a independent every optical amplifier. However, in case an interval exceeding a predetermined value is provided between adjacent semiconductor optical amplifiers, electric interference between the adjacent semiconductor optical amplifiers can be reduced up to a practical level. The typical value of such distance is approximately 200 μm.

In the manufacturing method and the structure of such a semiconductor optical device, as described above referring to FIG. 1, an optical element including an optical demultiplexer and an optical multiplexer such as AWG is formed by combining optical waveguides. When plural optical elements are integrated, an optical element having satisfactory relative precision in not only the composition of material but also the shape of a processed optical waveguide is acquired. Stable optical connection between the optical element and the semiconductor optical amplifier is achieved by deposition in a chamber the degree of vacuum of which is high.

In the embodiment described above, the GaInNAs semiconductor included in the core semiconductor film has a band gap corresponding to a shorter wavelength than the wavelength of light to be amplified in the optical amplification part. Therefore, both light to be amplified in the optical amplification part and light amplified in the optical amplification part can be propagated in the core semiconductor film.

As the active layer includes a $Ga_xIn_{1-x}N_yAs_{1-y}$ semiconductor and each of the optical multiplexer and the optical demultiplexer includes the optical waveguide including at least either of a GaInNAs semiconductor or a GaAs semiconductor, light of wavelengths in a wide range can be managed by combining suitable materials. Concretely, optical amplification, optical generation and the propagation of light are enabled in a range of wavelengths between 1.25 μm and 1.65 μm.

Further, as the optical waveguide part is formed after the optical amplification part is formed on the GaAs substrate 50, the optical waveguide can be formed by etching without being limited by the existence of the optical amplification part. When the optical waveguide is etched, the optical amplification part is not substantially influenced. Satisfactory optical connection is achieved between the active layer and the core semiconductor layer though the optical amplification part and the optical waveguide part are mutually independent.

Next, the composition applied to the active layer and the structure of the active layer will be described. In the following description, the clad layer is composed so that the lattice constant is matched with that of the GaAs semiconductor substrate.

In case the quantum well layer is made of a $Ga_xIn_{1-x}N_yAs_{1-y}$ semiconductor and the quantum barrier layer is made of a GaAs semiconductor, it is possible that x is approximately 0.65, preferably $0.62 \leq x \leq 0.68$ and $0.005 \leq y \leq 0.04$ for the $Ga_xIn_{1-x}N_yAs_{1-y}$ semiconductor in the quantum well layer.

Figure 13:
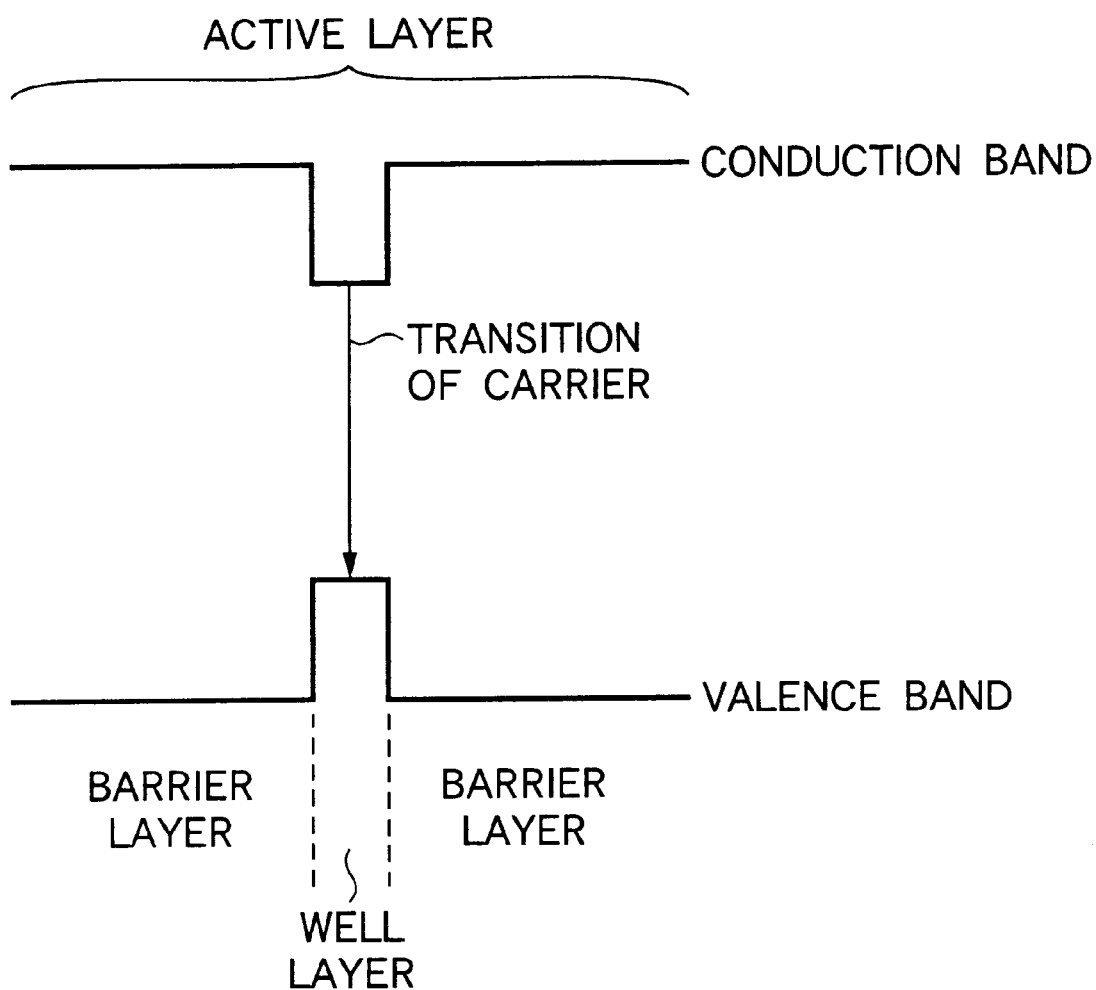
FIG. 13 is a diagram related to emission in an active layer.
Figure 14:
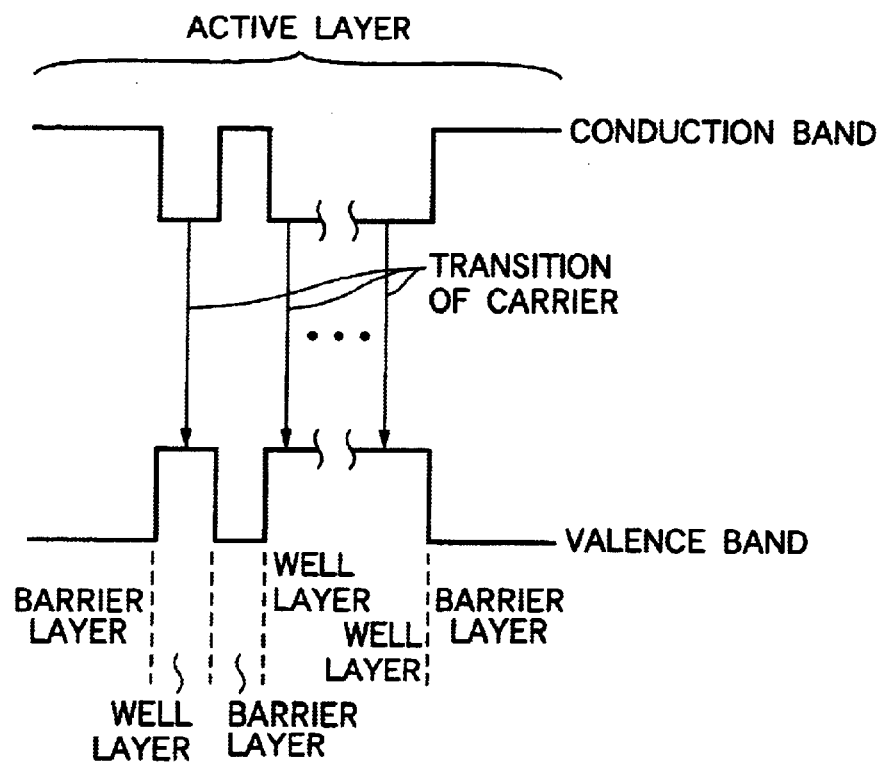
FIG. 14 is a band diagram related to emission in the active layer.

In such a range of composition, lattice unmatching of approximately 2% is achieved between the $Ga_xIn_{1-x}N_yAs_{1-y}$ semiconductor in the quantum well layer and a GaAs semiconductor. So-called type I of band structure shown in FIGS. 13 and 14 is achieved.

In case the quantum well layer is made of a $Ga_xIn_{1-x}N_yAs_{1-y}$ semiconductor and the quantum barrier layer is made of an AlGaAs semiconductor, it is possible that $0.70 \leq x \leq 0.87$ and $0.035 \leq y \leq 0.1$ for the $Ga_xIn_{1-x}N_yAs_{1-y}$ semiconductor in the quantum well layer. The composition of $Ga_{0.87}In_{0.13}N_{0.035}As_{0.965}$ can correspond to a wavelength of 1.25 μm and the composition of $Ga_{0.7}In_{0.3}N_{0.1}As_{0.9}$ can correspond to a wavelength of 1.65 μm.

In such a range of composition, lattice matching is substantially achieved for the $Ga_xIn_{1-x}N_yAs_{1-y}$ semiconductor in the quantum well layer. In this case, so-called type I of band structure shown in FIGS. 13 and 14 is also achieved.

Further, in case the quantum well layer is made of a $Ga_xIn_{1-x}N_yAs_{1-y}$ semiconductor and the quantum barrier layer includes a $Ga_zIn_{1-z}As$ semiconductor (z includes 1), it is possible that $0.7 \leq x \leq 0.9$ and $0.035 \leq y \leq 0.06$ for the $Ga_xIn_{1-x}N_yAs_{1-y}$ semiconductor in the quantum well layer. The composition of $Ga_{0.75}In_{0.25}N_{0.055}As_{0.945}$ can correspond to a wavelength of 1.65 μm and the composition of $Ga_{0.9}In_{0.1}N_{0.035}As_{0.965}$ can correspond to a wavelength of 1.25 μm.

Figure 15:
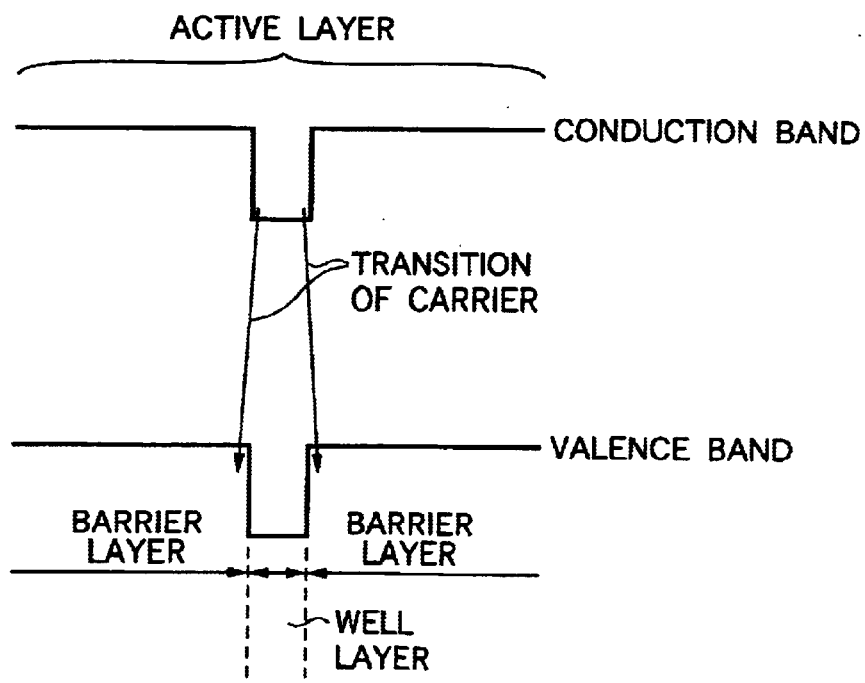
FIG. 15 is a band diagram related to emission in the active layer.
Figure 16:
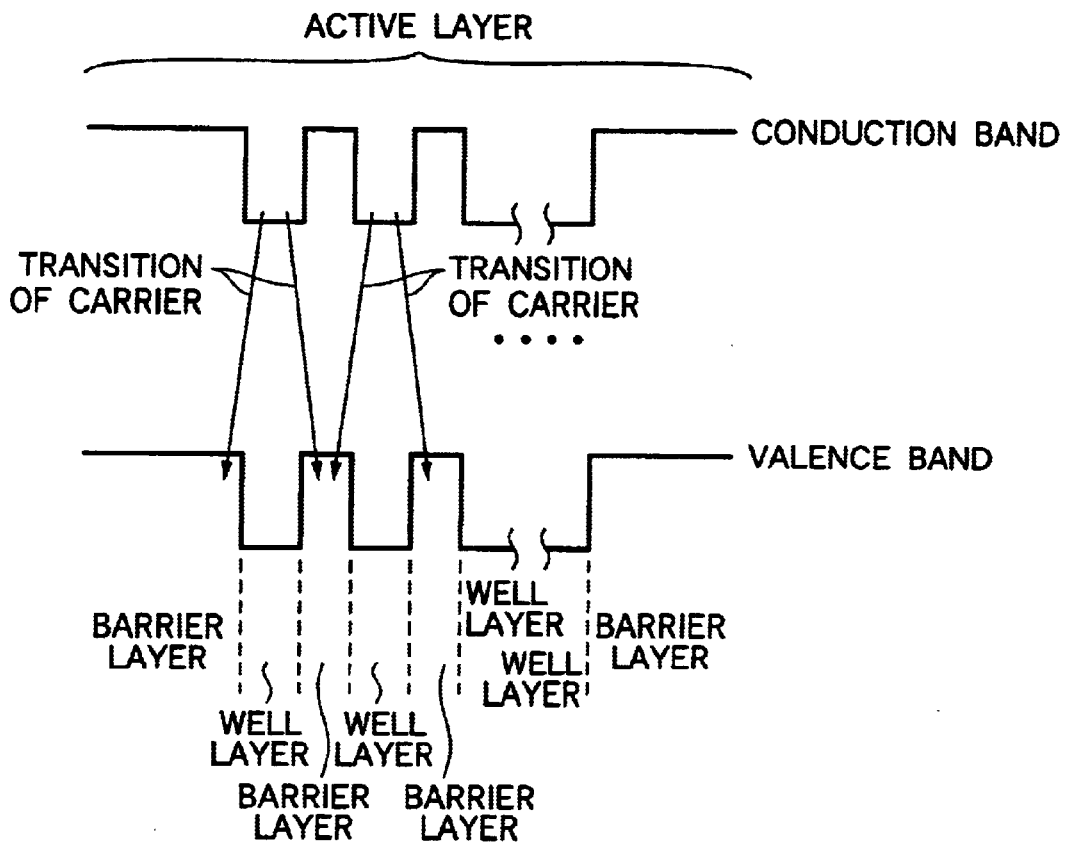
FIG. 16 is a band diagram related to emission in the active layer.

In such a range of composition, so-called type II of quantum well structure shown in FIGS. 15 and 16 is achieved. Optical transition at this time is caused between a quantum level in a conduction band of the quantum well layer (made of $Ga_xIn_{1-x}N_yAs_{1-y}$) and a valence band of the barrier layer (made of $Ga_zIn_{1-z}As$) or a quantum level in a valence band in the case of the quantum barrier layer.

For a concrete example of such structure, five sets of an n-type GaAs buffer layer approximately 0.2 μm thick, an n-type $Al_{0.3}Ga_{0.7}As$ clad layer approximately 2 μm thick, an undoped GaAs quantum barrier layer approximately 30 nm thick, an undoped GaAs quantum barrier layer approximately 18 nm thick, and undoped $Ga_{0.85}In_{0.15}N_{0.055}As_{0.945}$ quantum well layers approximately 8 nm thick, a p-type GaAs clad layer approximately 2 μm thick and a p-type GaAs contact layer are sequentially grown on an n-type GaAs substrate. As this quantum well structure shows the characteristic of so-called type II, an electron is confined in the quantum well layer and a hole is confined in the quantum barrier layer. Light of a wavelength in a band of 1.5 μm is generated by the recombination of these carriers. Also, when an undoped $Ga_{0.87}In_{0.13}N_{0.045}As_{0.955}$ quantum well layer is adopted, light of a wavelength in a band of 1.3 μm can be generated.

Furthermore, for an active layer made of a $Ga_xIn_{1-x}N_yAs_{1-y}$ bulk semiconductor, it is possible that $0.7 \leq x \leq 0.9$ and $0.03 \leq y \leq 0.1$. The semiconductor of such composition can be suitably applied to a so-called bulk type of active layer having no SQW structure and no MQW structure.

Figure 17:
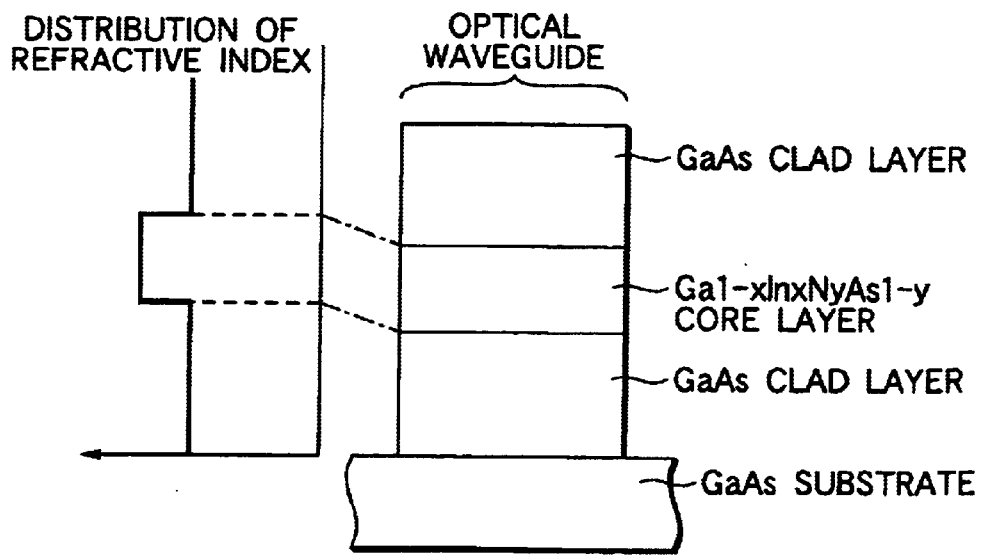
FIG. 17 a sectional view showing the section of an optical waveguide.
Figure 18:
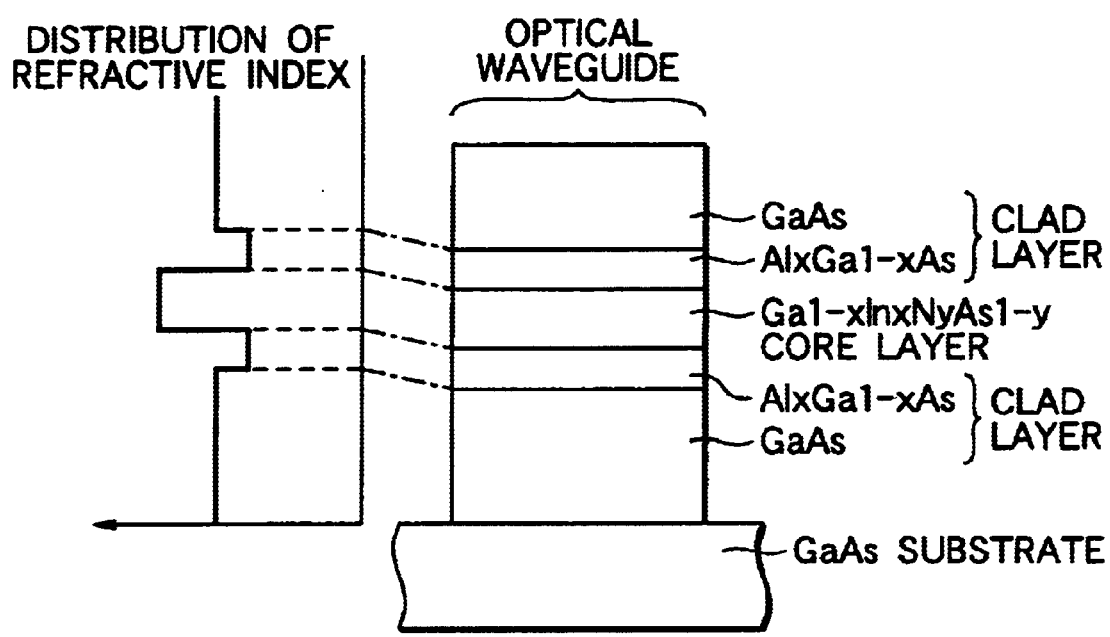
FIG. 18 is a sectional view showing the section of the optical waveguide.

FIGS. 17 and 18 show the structure of an optical waveguide and the distribution of the refractive index. The optical waveguide part includes a core semiconductor layer having a predetermined refractive index, first and second clad layers respectively having a smaller refractive index than that of the core semiconductor layer. The core semiconductor layer includes at least either of a GaInNAs semiconductor or a GaAs semiconductor. The first and second clad semiconductor layers are provided so that the core semiconductor layer is put between them.

An optical waveguide shown in FIG. 17 is provided with a core including a $Ga_{1-x}In_xN_yAs_{1-y}$ semiconductor, first and second clad parts having the core between them and including a GaAs semiconductor. For example, a range of the values of "x" suitable for a wavelength in a band of 1.5 μm is $0.8 \leq x \leq 0.95$ and a range of suitable values of "y" is $0.015 \leq y \leq 0.04$. It is for the composition corresponding to wavelengths of 1.1 to 1.35 μm in the characteristic of a $Ga_{1-x}In_xN_yAs_{1-y}$ bulk semiconductor that such a range is suitable and it is because the composition shows transparent material to light in a band of 1.5 μm.

An optical waveguide shown in FIG. 18 is provided with a core including a $Ga_{1-x}In_xN_yAs_{1-y}$ semiconductor, a pair of inside clad layers including an $Al_zGa_{1-z}As$ semiconductor provided with the core between them and a pair of outside clad layers arranged outside the pair of inside clad layers. A range of values of "x" suitable for a wavelength in a band of 1.3 μm is $0.9 \leq x \leq 1.0$ and a range of suitable values of "y" is $0 \leq y \leq 0.03$. It is for the composition that becomes transparent to light of a wavelength of 1.3 μm as in a band of 1.5 μm that such a range is suitable.

Figure 19:
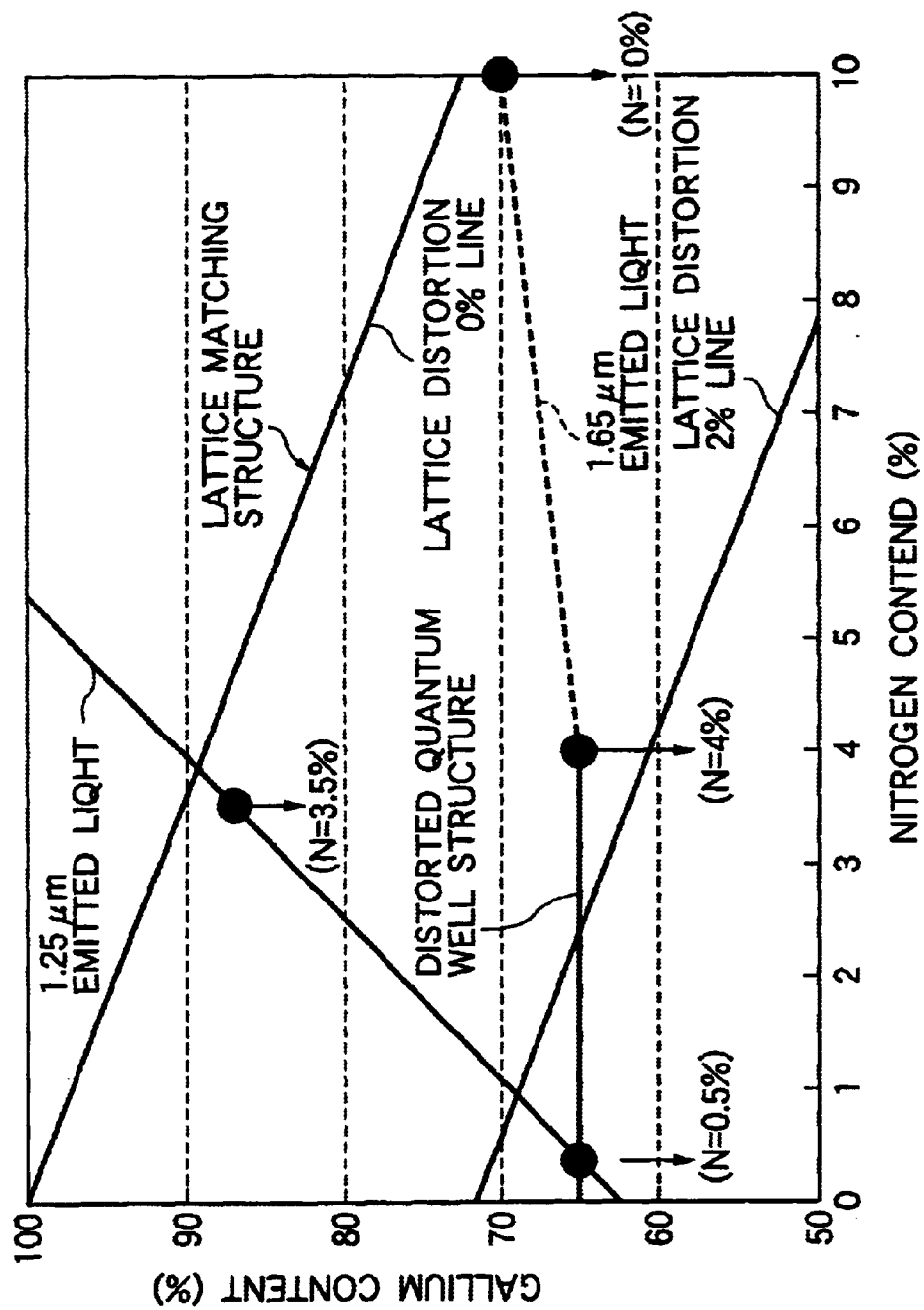
FIG. 19 shows the composition of a GaInNAs semiconductor.

FIGS. 19 and 20 schematically explain the contents described about the GaInNAs semiconductor so far. FIG. 19 shows a condition of the composition of type I of quantum well structure with an AlGaAs semiconductor as a barrier layer based upon experiments made by these inventors. In FIG. 19, the x-axis shows a percentage expressing the ratio of nitrogen content to Family V by a mole and the y-axis shows gallium content to Family III expressed by a mole by percentage. In this embodiment, the semiconductor optical device for managing light in a range of wavelengths between 1.25 μm and 1.65 μm is disclosed.

FIG. 20 shows a condition of the composition of a GaInNAs semiconductor related to type I and type II of quantum well structure having a $Ga_zIn_{1-z}As$ (z includes 1) semiconductor as a barrier layer based upon experiments made by these inventors. In FIG. 20, a broken line A for segmenting a type I transition area and a type II transition area is shown.

In the type I transition area, emitted light of a wavelength of 1.2 μm, emitted light of a wavelength of 1.3 μm and emitted light of a wavelength of 1.5 μm are shown.

In the type II transition area, emitted light of a wavelength of 1.2 μm, emitted light of a wavelength of 1.3 μm, emitted light of a wavelength of 1.5 μm and emitted light of a wavelength of 1.7 μm are shown.

As described above, as the active layer including a GaInNAs semiconductor and the core semiconductor layer including at least either of a GaInNAs semiconductor or a GaAs semiconductor are formed on the GaAs semiconductor substrate, the semiconductor optical device suitable for managing wavelengths in a wide range is provided.

The case that optical amplification and an optical gate function are realized using the semiconductor optical amplifier is described above, however, mutual gain modulation and mutual phase modulation are enabled by inputting an optical signal the intensity of which is modulated. Wavelength conversion is also enabled by mixing four light waves in the semiconductor optical amplifier. In the optical waveguide part, the optical multiplexer and the optical demultiplexer are given as an example, however, Mach-Zehnder interferometer is produced and can be also combined with the optical amplifier. Further, Bragg diffraction grating is produced inside the optical waveguide and a wavelength selecting function is validated.

As described above, the semiconductor optical device according to the invention is provided with the optical waveguide part and the optical amplification part respectively provided monolithically on the GaAs semiconductor substrate. The semiconductor optical amplifier is provided with the active layer including a $Ga_xIn_{1-x}N_yAs_{1-y}$ semiconductor, the first conductive type clad layer and the second conductive type clad layer respectively provided with the active layer between them. The optical waveguide is provided with the core semiconductor layer including at least either of a GaInNAs semiconductor or a GaAs semiconductor, the first and second clad semiconductor layers respectively provided with the core semiconductor layer between them.

As described above, as the GaAs semiconductor substrate is adopted, optical elements can be integrated on the satisfactory substrate having a large aperture. That is, plural optical elements such as the optical demultiplexer and the optical multiplexer and the semiconductor optical amplifier can be monolithically integrated on the GaAs semiconductor substrate. Hereby, the optical element having satisfactory relative precision in not only the composition of the materials but the shape of the processed optical waveguide is acquired. As the active layer includes a $Ga_xIn_{1-x}N_yAs_{1-y}$ semiconductor and the optical waveguide and each of the optical multiplexer and the optical demultiplexer respectively including the optical waveguide include at least either of a GaInNAs semiconductor or a GaAs semiconductor, light of wavelengths in a wide range can be managed by combining materials of suitable composition. Therefore, the semiconductor optical device wherein the optical amplifier, the optical waveguide and optical elements are integrated on the GaAs semiconductor substrate is provided.

Further, according to the method of manufacturing the semiconductor optical device of the invention, as the optical waveguide part is formed after the optical amplification part is formed on the GaAs substrate 50, the optical waveguide can be formed by etching without being limited by the existence of the optical amplification part. When the optical waveguide is etched, the optical amplification part is not substantially influenced. Satisfactory optical connection is achieved between the active layer and the core semiconductor layer though the optical amplification part and the optical waveguide part are mutually independent.

What is claimed is:

1. A semiconductor optical device, comprising:
   a GaAs semiconductor substrate;
   an optical waveguide part including at least one optical element having an optical waveguide, the optical waveguide having a core semiconductor layer and first and second clad semiconductor layers, the core semiconductor layer including at least one of a GaInNAs semiconductor and a GaAs semiconductor and provided on the GaAs semiconductor substrate, the first and second clad semiconductor layers respectively provided on the GaAs semiconductor substrate with the core semiconductor layer therebetween; and
   an optical amplification part including at least one semiconductor optical amplifier having an active layer and first and second conductive-type clad layers, the active layer including a $Ga_xIn_{1-x}N_yAs_{1-y}$ semiconductor and provided on the GaAs semiconductor substrate with the active layer adjacent to the core semiconductor layer, the first and second conductive-type clad layers respectively provided on the GaAs semiconductor substrate with the active layer therebetween,
   wherein the optical waveguide part and the optical amplification part are separate and optically connected with each other and integrated on the GaAs semiconductor substrate.

2. The semiconductor optical device according to claim 1, wherein the $Ga_xIn_{1-x}N_yAs_{1-y}$ semiconductor of said active layer satisfies following equation:

$$0.7 \leq x \leq 0.9 \text{ and } 0.03 \leq y \leq 0.1.$$

3. The semiconductor optical device according to claim 1, wherein the active layer comprises at least one quantum well layer made of a $Ga_xIn_{1-x}N_yAs_{1-y}$ semiconductor and quantum barrier layers made of a GaAs semiconductor provided with the quantum well layer therebetween, and the $Ga_xIn_{1-x}N_yAs_{1-y}$ semiconductor satisfies following equation:

$$x \approx 0.65 \text{ and } 0.005 \leq y \leq 0.04.$$

4. The semiconductor optical device according to claim 1, wherein the active layer comprises at least one quantum well layer made of a $Ga_xIn_{1-x}N_yAs_{1-y}$ semiconductor and quantum barrier layers made of an AlGaAs semiconductor provided with the quantum well layer therebetween, and the $Ga_xIn_{1-x}N_yAs_{1-y}$ semiconductor satisfies following equation:

$$0.7 \leq x \leq 0.87 \text{ and } 0.035 \leq y \leq 0.1.$$

5. The semiconductor optical device according to claim 1, wherein the active layer comprises at least one quantum well layer made of a $Ga_xIn_{1-x}N_yAs_{1-y}$ semiconductor and quantum barrier layers made of a $Ga_zIn_{1-z}As$ semiconductor provided with the quantum well layer therebetween, and the $Ga_zIn_{1-z}As$ semiconductor and the $Ga_xIn_{1-x}N_yAs_{1-y}$ semiconductor satisfy following equation:

$$0.7 \leq x \leq 0.9, \ 0.35 \leq y \leq 0.06 \text{ and } 0 < z \leq 1.$$

6. The semiconductor optical device according to claim 1, wherein said optical element includes an optical multiplexer having a plurality of input ports and at least one output port, the input port optically connected to said semiconductor optical amplifier.

7. The semiconductor optical device according to of claim 1, wherein said optical element includes an optical demultiplexer having at least one input port and a plurality of output ports, the output port optically connected to said semiconductor optical amplifier.

8. The semiconductor optical device according to claim 1, wherein said core semiconductor layer includes the GaInNAs semiconductor having a band gap larger than energy for the part.

9. The semiconductor optical device according to of claim 6, wherein said optical element further includes an optical demultiplexer having at least one input port and a plurality of output ports, the output port optically connected to said semiconductor optical amplifier.

10. The semiconductor optical device according to claim 3, wherein the $Ga_xIn_{1-x}N_yAs_{1-y}$ semiconductor satisfies following equation:

$$0.62 \leq x \leq 0.68.$$

11. A method of manufacturing a semiconductor optical device, said method comprising steps of:
(1) preparing a GaAs semiconductor substrate;
(2) forming an optical amplification part having a first conductive type clad layer, an active layer including a $Ga_xIn_{1-x}N_yAs_{1-y}$ semiconductor and a second conductive type clad layer in a first area on the GaAs semiconductor substrate;
(3) forming an optical element including an optical waveguide having a first clad semiconductor layer, a core semiconductor layer including at least one of a GaInNAs semiconductor having a band gap larger than the $Ga_xIn_{1-x}N_yAs_{1-y}$ semiconductor and a GaAs semiconductor and a second clad semiconductor layer in a second area on the GaAs semiconductor substrate,
wherein the optical waveguide part and the optical amplification part are separate and optically connected with each other and integrated on the GaAs semiconductor substrate.

12. The method according to claim 11, further comprises a step of:
(4) forming at least one of an optical multiplexer and an optical demultiplexer in the second area on the GaAs semiconductor substrate.

13. The method according to claim 11, wherein said step (2) comprises substeps of:
(2a) sequentially forming a first conductive type clad film, an active layer film including a $Ga_xIn_{1-x}N_yAs_{1-y}$ semiconductor and a second conductive type clad film on the GaAs semiconductor substrate; and
(2b) etching the first conductive type clad film, the active layer film and the second conductive type clad film to form the first conductive type clad layer, the active layer and the second conductive type clad layer in the first area on the GaAs semiconductor substrate.

14. The method according to claim 11, wherein said step (3) comprises substeps of:
(3a) sequentially forming a first clad semiconductor film, a core semiconductor film including at least one of a GaInNAs semiconductor having a band gap larger than a $Ga_xIn_{1-x}N_yAs_{1-y}$ semiconductor and a GaAs semiconductor and a second clad semiconductor film in the second area on the GaAs semiconductor substrate;
(3b) etching the first clad semiconductor film, the core semiconductor film and the second clad semiconductor film to form the first clad semiconductor layer, the core semiconductor layer and the second clad semiconductor layer;
(3c) forming at least one of an optical multiplexer and an optical demultiplexer respectively in the second area on the GaAs semiconductor substrate.

* * * * *